US007146909B2

(12) United States Patent
Oohashi et al.

(10) Patent No.: US 7,146,909 B2
(45) Date of Patent: Dec. 12, 2006

(54) IMAGE FORMING MATERIAL

(75) Inventors: Hidekazu Oohashi, Shizuoka (JP); Kazuto Kunita, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 95 days.

(21) Appl. No.: 11/183,860

(22) Filed: Jul. 19, 2005

(65) Prior Publication Data

US 2006/0016356 A1 Jan. 26, 2006

(30) Foreign Application Priority Data

Jul. 20, 2004 (JP) .......................... P.2004-211872

(51) Int. Cl.
*G03F 7/039* (2006.01)

(52) U.S. Cl. ...................... 101/467; 101/465; 101/453; 101/456; 101/454; 430/332; 430/302; 430/348; 430/343; 503/218

(58) Field of Classification Search ................ 101/465
See application file for complete search history.

(56) References Cited

U.S. PATENT DOCUMENTS

| | | | | |
|---|---|---|---|---|
| 4,008,067 A * | 2/1977 | Hirono et al. | .............. | 504/293 |
| 4,978,759 A * | 12/1990 | Jouin et al. | ................. | 548/497 |
| 5,712,223 A * | 1/1998 | DeBoer et al. | ............. | 503/227 |
| 5,717,106 A * | 2/1998 | DeBoer et al. | .......... | 548/364.4 |
| 6,461,804 B1 * | 10/2002 | Deroover | .................... | 430/578 |

FOREIGN PATENT DOCUMENTS

| | | |
|---|---|---|
| JP | 2938397 B2 | 6/1999 |
| JP | 2000-211262 A | 8/2000 |
| JP | 2001-277740 A | 10/2001 |
| JP | 2002-137562 A | 5/2002 |

* cited by examiner

*Primary Examiner*—Andrew H. Hirshfeld
*Assistant Examiner*—Joshua D. Zimmerman
(74) *Attorney, Agent, or Firm*—Birch, Stewart, Kolasch & Birch, LLP

(57) ABSTRACT

An image forming material, a lithographic printing plate precursor and a lithographic printing method, in which a color image with good visibility is obtained by laser exposure, are provided, wherein the image forming material and the lithographic printing plate precursor each comprising a support and a layer comprising a compound represented by formula (1) which changes from a colorless state to a colored state by the effect of heat; and a lithographic printing method comprising on-press development using the lithographic printing plate precursor:

(1)

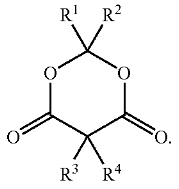

12 Claims, No Drawings

IMAGE FORMING MATERIAL

BACKGROUND OF THE INVENTION

1. Field of the Invention

The present invention relates to an image forming material using a novel color-change material, a lithographic printing plate precursor having an image forming layer using the color-change material, and a lithographic printing method using the lithographic printing plate precursor. More specifically, the present invention relates to an image forming material capable of forming an image by scanning an infrared laser based on digital signals of a computer or the like and ensuring a printout image with good visibility, a lithographic printing plate precursor having a layer using the color-change material, and a lithographic printing method using the printing plate precursor.

2. Background Art

The lithographic printing plate in general consists of a lipophilic image area of accepting ink in the printing process and a hydrophilic non-image area of accepting a fountain solution. In conventional plate-making, a lithographic printing plate is usually produced by subjecting a PS plate comprising a hydrophilic support having provided thereon a lipophilic photosensitive resin layer (image forming layer) to mask exposure through a lith film, and dissolving and thereby removing the unnecessary portion of the image forming layer with a developer.

In recent years, an image is electronically processed as digital information, stored and output by a computer. Accordingly, in the image formation processing according to the digital image information, an image is preferably formed directly on a lithographic printing plate precursor by scan exposure using high-directivity actinic radiation without intervention of a lith film. Such a technique of plate-making a printing plate based on distal image information without intervention of a lith film is called "computer-to-plate (CTP)".

When the conventional plate-making method using a PS plate for producing a printing plate is intended to implement by the CTP technique, a problem arises that the wavelength region of laser light does not agree with the photosensitive wavelength region of photosensitive resin.

Also, conventional PS plates indispensably requires a step of dissolving and removing the unnecessary portion of the image forming layer (development processing) after exposure. Moreover, an after-processing step of washing the developed printing plate with water or treating it with a rinsing solution containing a surfactant or with a desensitizing solution containing gum arabic or a starch derivative is also necessary. A great problem to be solved of conventional PS plates is that such additive wet processing is indispensable. Even when the first half (image formation processing) of the plate-making process is streamlined by the above-described digital processing, if the latter half (development processing) is a cumbersome wet processing, the effect by the streamlining is not satisfactorily exerted.

In particular, consideration for global environment recently becomes a great concern in the entire industry. The wet after-processing is preferably made simple or changed to a dry processing also in view of environmental consideration.

As one of the methods for dispensing with the processing step, a method called on-press development is known, where an exposed printing plate precursor is loaded on a cylinder of a printing press and a fountain solution and an ink are supplied while rotating the cylinder, thereby removing the unnecessary portion of the image forming. Namely, this is a system of loading a printing plate precursor as it is on a printing press after exposure and completing the processing during the normal printing process.

The lithographic printing plate precursor suited to such on-press development is required to have an image forming layer soluble in a fountain solution or an ink solvent and moreover, has an appropriate bright room handleability for enabling development on a printing press placed in a bright room.

These requirements cannot be substantially satisfied by conventional PS plates.

In order to satisfy these requirements, a lithographic printing plate precursor where an image forming layer comprising a hydrophilic binder polymer having dispersed therein hydrophobic thermoplastic polymer particles is provided on a hydrophilic support has been proposed (see, for example, Patent Document 1: Japanese Patent No. 2,938,397). In the plate-making, this lithographic printing plate precursor is exposed by an infrared laser to cause coalescence (fusion) of hydrophobic thermoplastic polymer particles by the effect of heat generated resulting from light-to-heat conversion and thereby form an image, and then loaded on a cylinder of a printing press, and at least either a fountain solution or an ink is supplied, whereby on-press development can be performed. This lithographic printing plate precursor has its photosensitive region in the infrared region and therefore, ensures handleability in a bright room.

However, the image formed by the coalescence (fusion) of hydrophobic thermoplastic polymer fine particles is insufficient in the strength and the press life as a printing plate has a problem.

Also, a lithographic printing plate precursor comprising, in place of the thermoplastic fine particle, a microcapsule enclosing a polymerizable compound has been proposed (see, for example, Patent Documents 2 to 7: JP-A-2000-211262 (the tem "JP-A" as used herein means an "unexamined published Japanese patent application"), JP-A-2001-277740, JP-A-2002-29162, JP-A-2002-46361, JP-A-2002-137562, JP-A-2002-326470; respectively). The printing plate precursor proposed here is advantageous in that the polymer image formed by a reaction of the polymerizable compound has higher strength than that of the image formed by the fusion of fine particles.

Furthermore, the polymerizable compound has high reactivity and therefore, many methods have been proposed for isolating the polymerizable compound by using a microcapsule (see, for example, Patent Documents 2 to 7). For the shell of the microcapsule, use of a thermally decomposable polymer has been proposed.

However, in the lithographic printing plate precursors not involving a development processing step before printing described in Patent Documents 2 to 7, the image formed by laser exposure can be hardly confirmed on the printing plate. Therefore, loading on a printing press encounters a problem that whether an objective image is recorded on the printing plate or what color ink is assigned to the plate cannot be confirmed or the top and bottom of the printing plate is wrongly disposed and the miss-operation is not found until the printing is performed. Accordingly, it is demanded to more enhance the visibility of the image after exposure.

SUMMARY OF THE INVENTION

An object of the present invention is to provide an image forming material and a lithographic printing plate precursor, in which a color image (printout image) with good visibility is obtained by laser exposure, and a lithographic printing method using the printing plate precursor.

As a result of intensive investigations to attain this object, the present inventors have found that when a novel color-change material is used, a color image with good visibility can be formed by laser exposure and the above-described problems can be overcome. The present invention has been accomplished based on this finding.

That is, the present invention is as follows.

1. An image forming material comprising a support and a layer, wherein the layer comprises a compound that is represented by formula (1) and changes from a colorless state to a colored state by the effect of heat.

(1)

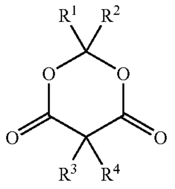

wherein $R^1$ to $R^4$ each independently represents a hydrogen atom, an alkyl group, an aryl group, an alkenyl group, an alkynyl group, a halogen atom, an acyl group, an alkyloxy group, an alkenyloxy group, an alkynyloxy group, an aryloxy group, a sulfonyl group, a sulfinyl group, an alkoxycarbonyl group, an aryloxycarbonyl group, an alkylthio group, an arylthio group, an acyloxy group, a sulfonyloxy group, a carbamoyloxy group, an amino group, a carbamoyl group, a sulfamoyl group, a hydroxyl group, a nitro group, a cyano group, a carboxyl group or a heterocyclic group.

2. An image forming material comprising a support and a layer, wherein the layer comprises: a compound represented by formula (1); and a compound of interacting with a thermal decomposition product of said compound represented by formula (1) to change color:

(1)

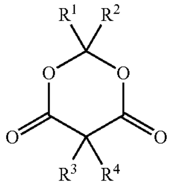

wherein $R^1$ to $R^4$ each independently represents a hydrogen atom, an alkyl group, an aryl group, an alkenyl group, an alkynyl group, a halogen atom, an acyl group, an alkyloxy group, an alkenyloxy group, an alkynyloxy group, an aryloxy group, a sulfonyl group, a sulfinyl group, an alkoxycarbonyl group, an aryloxycarbonyl group, an alkylthio group, an arylthio group, an acyloxy group, a sulfonyloxy group, a carbamoyloxy group, an amino group, a carbamoyl group, a sulfamoyl group, a hydroxyl group, a nitro group, a cyano group, a carboxyl group or a heterocyclic group.

3. A lithographic printing plate precursor comprising a surface-hydrophilic support and a layer, wherein the layer comprises a compound that is represented by formula (1) and changes from a colorless state to a colored state by the effect of heat:

(1)

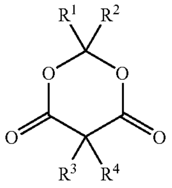

wherein $R^1$ to $R^4$ each independently represents a hydrogen atom, an alkyl group, an aryl group, an alkenyl group, an alkynyl group, a halogen atom, an acyl group, an alkyloxy group, an alkenyloxy group, an alkynyloxy group, an aryloxy group, a sulfonyl group, a sulfinyl group, an alkoxycarbonyl group, an aryloxycarbonyl group, an alkylthio group, an arylthio group, an acyloxy group, a sulfonyloxy group, a carbamoyloxy group, an amino group, a carbamoyl group, a sulfamoyl group, a hydroxyl group, a nitro group, a cyano group, a carboxyl group or a heterocyclic group.

4. A lithographic printing plate precursor comprising a surface-hydrophilic support and a layer, wherein the layer comprises: a compound represented by formula (1); and a compound of interacting with a thermal decomposition product of said compound represented by formula (1) to change color:

(1)

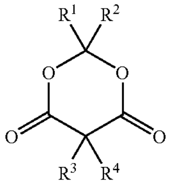

wherein $R^1$ to $R^4$ each independently represents a hydrogen atom, an alkyl group, an aryl group, an alkenyl group, an alkynyl group, a halogen atom, an acyl group, an alkyloxy group, an alkenyloxy group, an alkynyloxy group, an aryloxy group, a sulfonyl group, a sulfinyl group, an alkoxycarbonyl group, an aryloxycarbonyl group, an alkylthio group, an arylthio group, an acyloxy group, a sulfonyloxy group, a carbamoyloxy group, an amino group, a carbamoyl group, a sulfamoyl group; a hydroxyl group, a nitro group, a cyano group, a carboxyl group or a heterocyclic group.

5. The lithographic printing plate precursor as described in the above item 3, wherein the layer further comprises a radical polymerization initiator and a radical polymerizable compound.

6. The lithographic printing plate precursor as described in the above item 4, wherein the layer further comprises a radical polymerization initiator and a radical polymerizable compound.

7. The lithographic printing plate precursor as described in the above item 3, which is capable of recording an image by exposure with an infrared laser.

8. The lithographic printing plate precursor as described in the above item 4, which is capable of recording an image by exposure with an infrared laser.

9. The lithographic printing plate precursor as described in the above item 3, which is capable of performing printing by loading said lithographic printing plate precursor on a printing press without passing through a development step after recording an image, or by recording an image after loading said lithographic printing plate precursor on a printing press.

10. The lithographic printing plate precursor as described in the above item 4, which is capable of performing printing by loading said lithographic printing plate precursor on a printing press without passing through a development step after recording an image, or by recording an image after loading said lithographic printing plate precursor on a printing press.

11. A lithographic printing method comprising performing printing by loading the lithographic printing plate precursor described in any one of the above items on a printing press without passing through a development step after recording an image, or by recording an image after loading said lithographic printing plate precursor on a printing press.

According to the present invention, an image forming material and a lithographic printing plate precursor, in which a color image with good visibility is obtained by laser exposure, and a lithographic printing method using the printing plate precursor can be provided.

DETAILED DESCRIPTION OF THE INVENTION

One embodiment of the present invention is an image forming material comprising a support and a layer comprising a compound represented by formula (1) which changes from a colorless state to a colored state by the effect of heat:

(1)

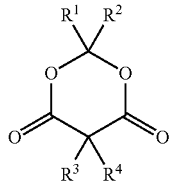

wherein $R^1$ to $R^4$ each independently represents a hydrogen atom, an alkyl group (e.g., methyl, ethyl, propyl, isopropyl, n-butyl, isobutyl, sec-butyl, tert-butyl, cyclohexyl, methoxyethyl, ethoxycarbonylethyl, cyanoethyl, diethylaminoethyl, hydroxyethyl, chloroethyl, acetoxyethyl, benzyl, carboxybenzyl), an aryl group (e.g., phenyl, 4-methylphenyl, 4-methoxyphenyl, 4-carboxyphenyl, 3,5-dicarboxyphenyl, naphthyl, anthranyl), an alkenyl group (e.g., vinyl), an alkynyl group (e.g., ethynyl), a halogen atom (e.g., fluorine, chlorine, bromine, iodine), an acyl group (e.g., acetyl, propionyl, butanoyl, chloroacetyl), an alkyloxy group (e.g., methoxy, ethoxy, n-butoxy, methoxyethoxy), an alkenyloxy group (e.g., vinyloxy), an alkynyloxy group (e.g., ethenyloxy), an aryloxy group (e.g., phenoxy, 4-methoxyphenoxy, naphthyloxy), a sulfonyl group (e.g., methanesulfonyl, p-toluenesulfonyl), a sulfinyl group (e.g., methanesulfinyl, ethanesulfinyl, octanesulfinyl), an alkoxycarbonyl group (e.g., methoxycarbonyl, ethoxycarbonyl), an aryloxycarbonyl group (e.g., phenoxycarbonyl, 4-methylphenoxycarbonyl, 4-methoxyphenoxycarbonyl, naphthyloxycarbonyl), an alkylthio group (e.g., methylthio, ethylthio), an arylthio group (e.g., phenylthio, naphthylthio), an acyloxy group (e.g., acetoxy, ethylcarbonyloxy, cyclohexylcarbonyloxy, benzoyloxy, chloroacetyloxy), a sulfonyloxy group (e.g., methanesulfonyloxy), a carbamoyloxy group (e.g., methylcarbamoyloxy, diethylcarbamoyloxy), an amino group (e.g., methylamino, dimethylamino, diethylamino, anilino, methoxyphenylamino, chlorophenylamino, morpholino, piperidino, pyrrolidino, pyridylamino, methoxycarbonylamino, n-butoxycarbonylamino, phenoxycarbonylamino, methylcarbamoylamino, phenoxycarbamoylamino, ethylthiocarbamoylamino, methylsulfamoylamino, phenylsulfamoylamino, cetylamino, ethylcarbonylamino, ethylthiocarbonylamino, cyclohexylcarbonylamino, benzoylamino, chloroacetylamino, methanesulfonylamino, benzenesulfonylamino), a carbamoyl group (e.g., unsubstituted carbamoyl, methylcarbamoyl, ethylcarbamoyl, n-butylcarbamoyl, tert-butylcarbamoyl, dimethylcarbamoyl, morpholinocarbamoyl, pyrrolidinocarbamoyl), a sulfamoyl group (e.g., unsubstituted sulfamoyl, methylsulfamoyl, phenylsulfamoyl), a hydroxyl group, a nitro group, a cyano group, a carboxyl group or a heterocyclic group (e.g., oxazole, benzoxazole, thiazole, benzothiazole, imidazole, benzimidazole, indolenine, pyridine, sulfolane, furan, thiophene, pyrazole, pyrrole, chroman, coumarin).

In formula (1), $R^1$ and $R^2$ may be linked to form a ring, and $R^3$ and $R^4$ may join together to form a functional group represented by the following formula (2):

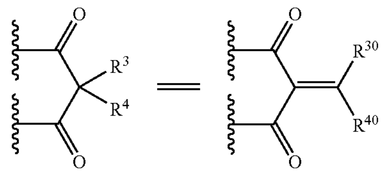

(2)

In formula (2), $R^{30}$ and $R^{40}$ each independently represents a functional group defined in $R^1$ to $R^4$.

The compound of changing from a colorless state to a colored state by the effect of heat, represented by formula (1), which is used for the image forming material of the present invention, is a compound such that the compound represented by formula (1) is colorless before heating and is decomposed and colored under heating. The "colorless" as used herein means that the difference in color between a layer containing the compound represented by formula (1) and a layer not containing the compound cannot be confirmed with an eye, more specifically, the lightness difference (ΔL) between a layer where the compound represented by formula (1) is added and a layer where the compound is not added is less than 1. On the contrary, the "colored" means that after heating, the difference in color between a layer where the compound represented by formula (1) is added and a layer where the compound is not added can be confirmed with an eye, more specifically, the lightness difference (ΔL) after heating between a layer where the compound represented by formula (1) is added and a layer where the compound is not added is 1 or more, preferably 2 or more.

Preferred examples of such a compound include a reaction product (III) of a dye (I) having a carbonyl group participating in color formation with a (2,2-disubstituted) malonic acid (II).

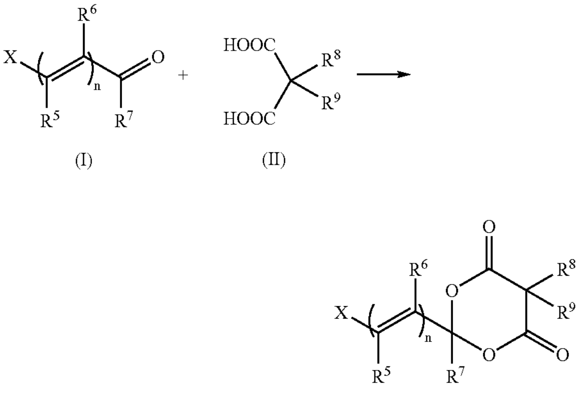

(I) (II)

(III)

wherein $R^5$ to $R^7$ each independently represents a functional group defined in $R^1$, the pairs of $R^5$ and $R^6$, $R^6$ and $R^7$, and $R^5$ and $R^7$ each may be linked to form a ring, $R^8$ and $R^9$ each independently represents a functional group defined in $R^3$ and $R^4$, X represents a functional group containing nitrogen, oxygen or sulfur conjugated with the carbon-carbon double bond to which $R^5$ and $R^6$ are bonded, and n represents a natural number.

In this reaction product, the carbonyl group participating in color formation disappears by the reaction with a malonic acid and therefore, absorption present in the visible region is lost to provide a colorless state. The carbonyl group appears under heating by the reaction shown below and the original dye (I) is formed, as a result, the reaction product is colored.

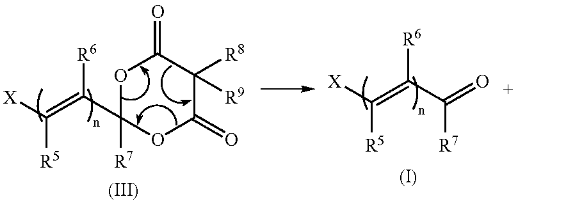

(III) (I)

Preferred examples of such a reaction product are set forth below, but the present invention is not limited thereto.

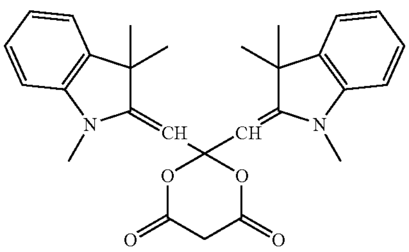

-continued

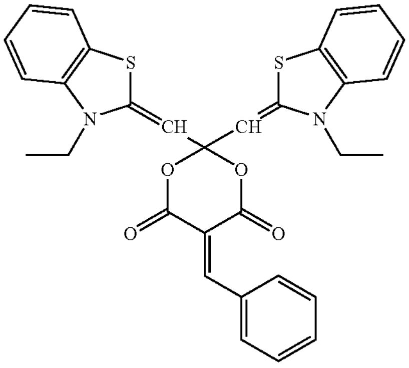

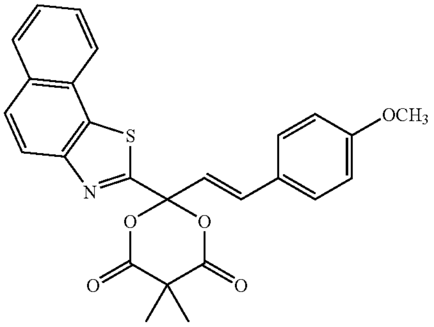

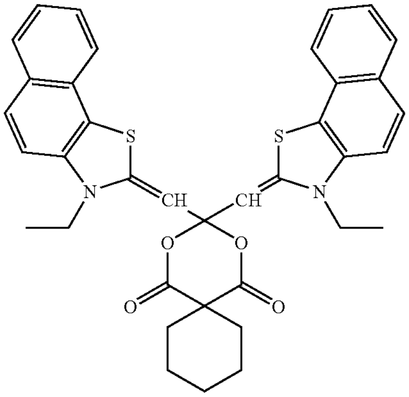

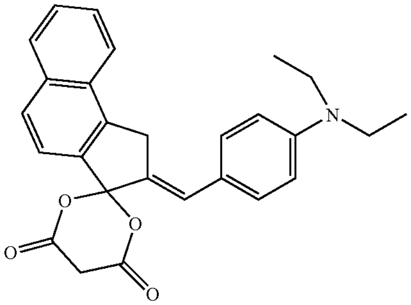

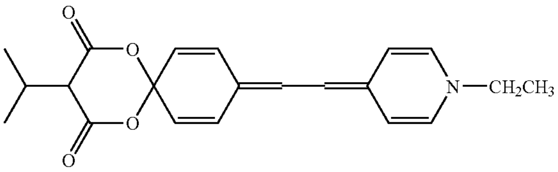

Another embodiment of the present invention is an image forming material comprising a support and a layer comprising a compound represented by formula (1) and a compound of interacting with a thermal decomposition product of the compound of the formula (1) and thereby changing in the color (hereinafter, referred to as "color-change compound"). In the case of this embodiment, the compound represented by formula (1) need not always change from a colorless state to a colored state by the effect of heat. As for the color-change compound, any compound may be used as long as when a layer containing the compound of formula (I) and a color-change compound is heated, the change in color can be confirmed with an eye, but the color-change compound is preferably a compound represented by the following formula (2):

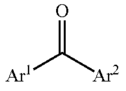

(2)

wherein $Ar^1$ and $Ar^2$ each independently represents an aryl group (e.g., phenyl, naphthyl, anthranyl, 3-methylphenyl, 4-methoxyphenyl, 2-chlorophenyl, 4-dimethylaminophenyl, 4-ethoxycarbonylphenyl), an alkyl group (e.g., methyl, ethyl, propyl, isopropyl, n-butyl, isobutyl, sec-butyl, tert-butyl, cyclohexyl, methoxyethyl, ethoxycarbonylethyl, cyanoethyl, diethylaminoethyl, hydroxyethyl, chloroethyl, acetoxyethyl, benzyl, carboxybenzyl) or a heterocyclic group (e.g., oxazole, benzoxazole, thiazole, benzothiazole, imidazole, benzimidazole, indolenine, pyridine, sulfolane, furan, thiophene, pyrazole, pyrrole, chroman, coumarin).

$Ar^1$ and $Ar^2$ may be linked through a single bond or a divalent linking group. Examples of the divalent linking group include —O—, —S— and —NR—. Examples of R include a hydrogen atom, an alkyl group, an aryl group, an alkynyl group, an alkenyl group, an acyl group, a heterocyclic group and a sulfonyl group.

Specific examples of the color-change compound are set forth below, but the present invention is not limited thereto.

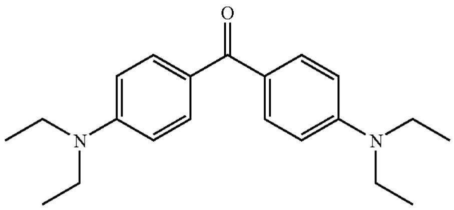

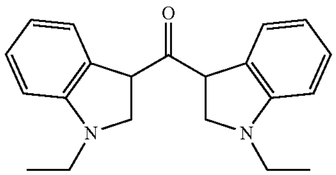

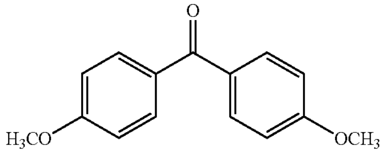

-continued

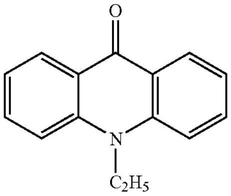

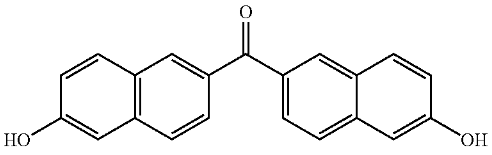

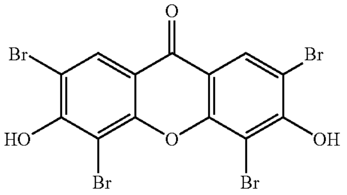

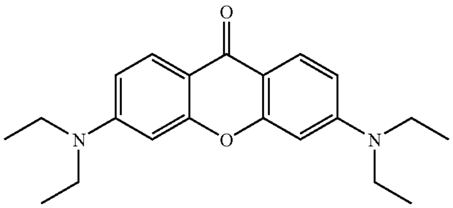

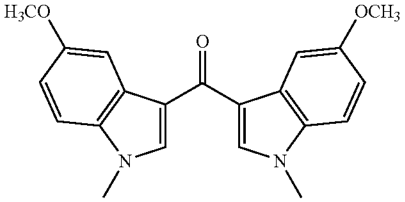

When a layer using such a color-change compound and a compound represented by formula (1) is heated, a thermal decomposition product of the compound represented by formula (1) interacts with the color-change compound, whereby a colored compound is formed and the layer is color-changed. Details of the interaction mechanism are not clearly known, but one example of the interaction mechanism is shown below.

A color forming material is produced through a lactone form (V) produced by the reaction of a thermal decomposition product (IV) of the compound represented by formula (1) with a compound represented by formula (2).

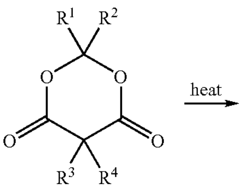

(1)

-continued

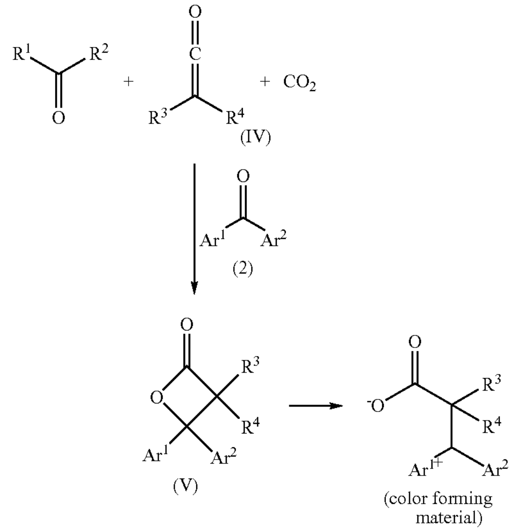

(IV)

(2)

(V)

In formulae, $R^1$ to $R^4$, $Ar^1$ and $Ar^2$ have the same meanings as above.

The layer containing a compound represented by formula (1) or the layer containing a compound represented by formula (1) and a compound of interacting with a thermal decomposition product of the compound and thereby changing in the color may be an image forming layer of forming a printing image by exposure or may be a layer other than the image forming layer. Examples of the layer other than the image forming layer include a protective layer (overcoat layer) and an undercoat layer. Among these, a protective layer is preferred.

The amount added of the compound represented by formula (1) per unit area of the image forming material is preferably from 0.001 to 1 $g/m^2$, more preferably from 0.005 to 0.5 $g/m^2$, and most preferably from 0.01 to 0.3 $g/m^2$.

The amount added of the compound of interacting a thermal decomposition product of the compound represented by formula (1) per unit area of the image forming material is preferably from 0.001 to 1 $g/m^2$, more preferably from 0.005 to 0.5 $g/m^2$, and most preferably from 0.01 to 0.3 $g/m^2$.

Within these ranges, good image visibility can be obtained.

[Other Components Used in Image Forming Layer]

<Radical Polymerization Initiator>

The radical polymerization initiator for use in the present invention indicates a compound of generating a radical by the effect of either one or both of light and heat energies and thereby initiating or accelerating the polymerization of a compound having a polymerizable unsaturated group. Examples of the radical polymerization initiator which can be used in the present invention include known thermopolymerization initiators, compounds having a bond with a small bond-dissociation energy, photopolymerization initiators, and known radical generators called a photo-oxidizing agent or a printing-out agent. In particular, the radical polymerization initiator suitably used in the present invention is a compound of generating a radical by the effect of heat energy.

The radical polymerization initiator for use in the present invention is described below in more detail, and these radical polymerization initiators can be used individually or in combination of two or more thereof.

Examples of such a radical polymerization initiator include organohalogen compounds, carbonyl compounds, organoperoxides, azo-based compounds, azide compounds, metallocene compounds, hexaarylbiimidazole compounds, organoboron compounds, disulfone compounds, oxime ester compounds and onium salt compounds.

Specific examples of the organohalogen compound include the compounds described in Wakabayashi et al., *Bull. Chem. Soc. Japan,* 42, 2924 (1969), U.S. Pat. No. 3,905,815, JP-B-46-4605 (the term "JP-B" as used herein means an "examined Japanese patent publication"), JP-A-48-36281, JP-A-53-133428, JP-A-55-32070, JP-A-60-239736, JP-A-61-169835, JP-A-61-169837, JP-A-62-58241, JP-A-62-212401, JP-A-63-70243, JP-A-63-298339, and M. P. Hutt, *Journal of Heterocyclic Chemistry,* 1, No. 3 (1970). Among these, oxazole compounds substituted with a trihalomethyl group and s-triazine compounds are preferred.

Furthermore, s-triazine derivatives having at least one mono-, di- or tri-halogenated methyl group bonded to the s-triazine ring are more preferred and specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.

Examples of the carbonyl compound include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone and 1,1,1-trichloromethyl-(p-butylphenyl)ketone; thioxantone derivatives such as thioxantone, 2-ethylthioxanthone, 2-isopropylthioxanthone, 2-chlorothioxanthone, 2,4-dimethylthioxanthone, 2,4-diethylthioxanthone and 2,4-diisopropylthioxanthone; benzoic acid ester derivatives such as ethyl p-dimethylaminobenzoate and ethyl p-diethylaminobenzoate.

Examples of the azo-based compound which can be used include azo compounds described in JP-A-8-108621.

Examples of the organoperoxide include trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxydicarbonate, di-2-ethylhexylperoxydicarbonate, di-2-ethoxyethylperoxydicarbonate, dimethoxyisopropylperoxycarbonate, di(3-methyl-3-methoxybutyl)peroxydicarbonate, tert-butylperoxyacetate, tert-butylperoxypivalate, tert-butylperoxyneodecanoate, tert-butylperoxyoctanoate, tert-butylperoxylaurate, tert-carbonate, 3,3',4,4'-tetra(tert-butyl-peroxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogendiphthalate) and carbonyl di(tert-hexylperoxydihydrogendiphthalate).

Examples of the metallocene compound include various titanocene compounds described in JP-A-59-152396, JP-A-61-151197, JP-A-63-41484, JP-A-2-249, JP-A-2-4705 and JP-A-5-83588, such as dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl and dimethylcyclopentadienyl-Ti-bis-2,3,4,5,6-pentafluorophen-1-yl, and iron-allene complexes described in JP-A-1-304453 and JP-A-1-152109.

Examples of the hexaarylbiimidazole compound include various compounds described in JP-B-6-29285 and U.S. Pat. Nos. 3,479,185, 4,311,783 and 4,622,286, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

Examples of the organoboron compound include organoborates described in JP-A-62-143044, JP-A-62-150242, JP-A-9-188685, JP-A-9-188686, JP-A-9-188710, JP-A-2000-131837, JP-A-2002-107916, Japanese Patent No. 2764769, JP-A-2002-116539, and Martin Kunz, *Rad Tech. '98. Proceeding Apr.* 19–22, 1998, *Chicago;* organoboron sulfonium complexes and organoboron oxosulfonium complexes described in JP-A-6-157623, JP-A-6-175564 and JP-A-6-175561; organoboron iodonium complexes described in JP-A-6-175554 and JP-A-6-175553; organoboron phosphonium complexes described in JP-A-9-188710; and organoboron transition metal coordination complexes described in JP-A-6-348011, JP-A-7-128785, JP-A-7-140589, JP-A-7-306527 and JP-A-7-292014.

Examples of the disulfone compound include compounds described in JP-A-61-166544 and JP-A-2003-328465.

Examples of the oxime ester compound include compounds described in *J. C. S. Perkin II,* 1653–1660 (1979), *J. C. S. Perkin II,* 156–162 (1979), *Journal of Photopolymer Science and Technology,* 202–232 (1995), JP-A-2000-66385 and JP-A-2000-80068. Specific examples thereof include the compounds represented by the following structural formulae.

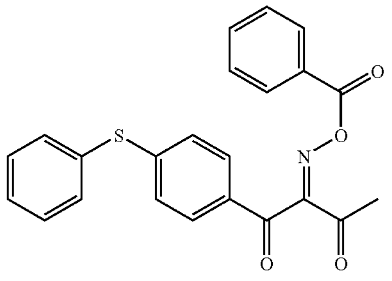

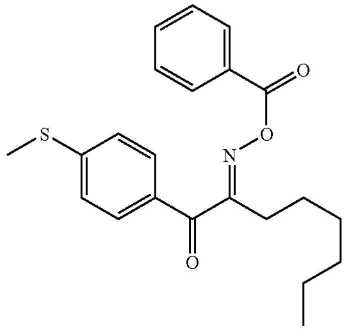

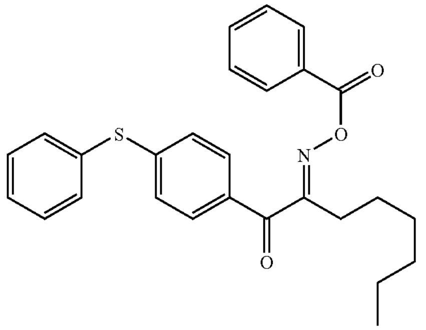

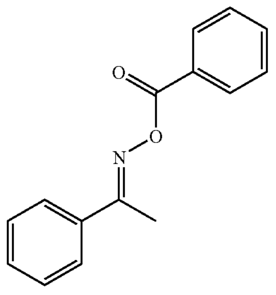

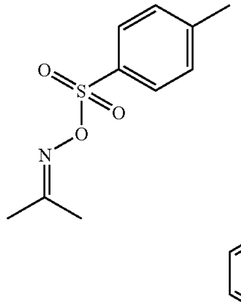

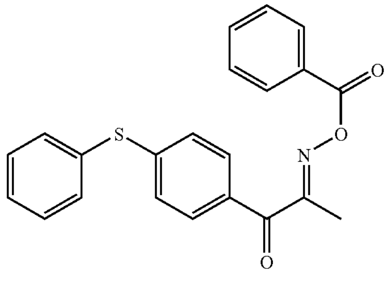

-continued
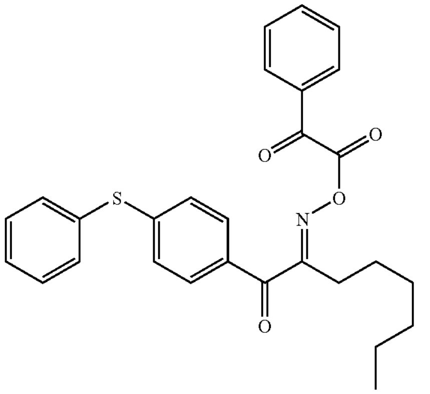
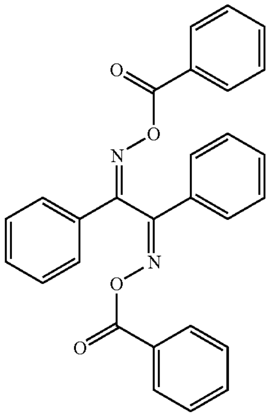
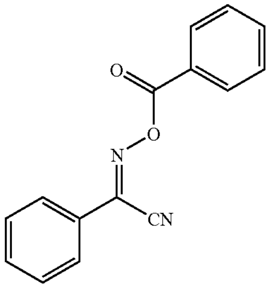
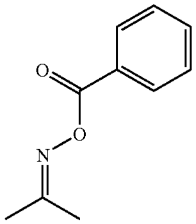
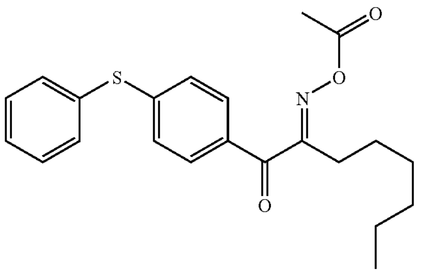
-continued
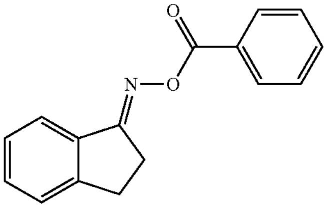
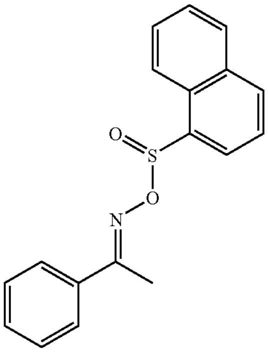
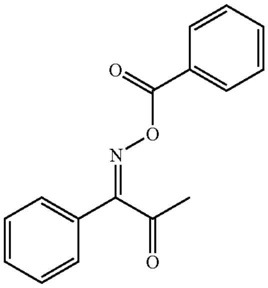
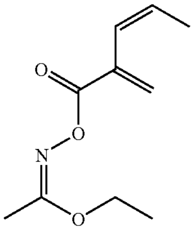
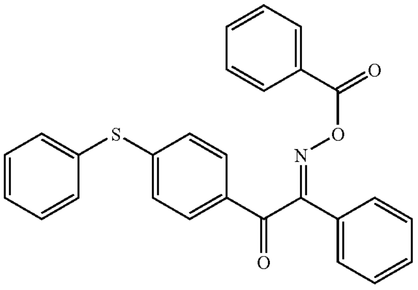
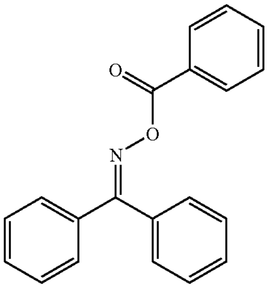

-continued

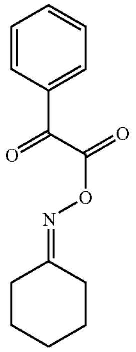

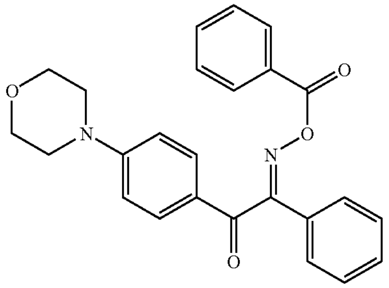

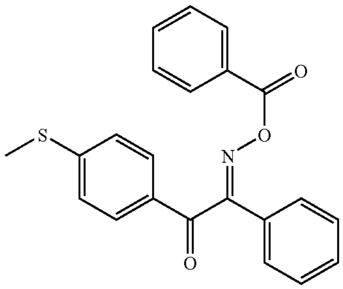

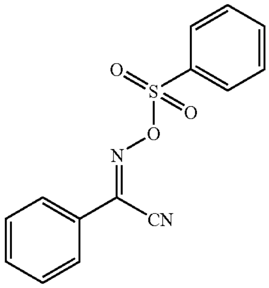

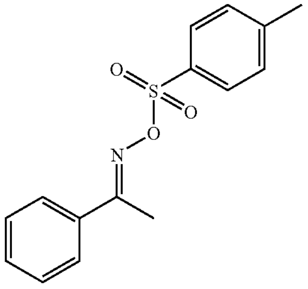

Examples of the onium salt compound include onium salts such as diazonium salts described in S. I. Schlesinger, *Photogr. Sci. Eng.,* 18, 387 (1974) and T. S. Bal et al., *Polymer,* 21, 423 (1980); ammonium salts described in U.S. Pat. No. 4,069,055 and JP-A-4-365049; phosphonium salts described in U.S. Pat. Nos. 4,069,055 and 4,069,056; iodonium salts described in European Patent 104,143, U.S. Pat. Nos. 339,049 and 410,201, JP-A-2-150848 and JP-A-2-296514; sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827, and German Patents 2,904,626, 3,604,580 and 3,604,581; selenonium salts described in J. V. Crivello et al., *Macromolecules,* 10 (6), 1307 (1977) and J. V. Crivello et al., *J. Polymer Sci.,* Polymer Chem. Ed., 17, 1047 (1979); and arsonium salts described in C. S. Wen et al., *Teh. Proc. Conf. Rad. Curing ASIA,* page 478 (Tokyo, October 1988).

Among these, oxime ester compounds and onium salts (diazonium salts, iodonium salts and sulfonium salts) are preferred in view of reactivity and stability.

The onium salt which is suitably used in the present invention is an onium salt represented by any one of the following formulae (RI-I) to (RI-III):

$$Ar_{11}-\overset{+}{N}\equiv N \quad Z_{11}^-$$ (RI-I)

$$Ar_{21}-\overset{+}{I}-Ar_{22} \quad Z_{21}^-$$ (RI-II)

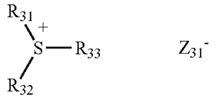

(RI-III)

In formula (RI-I), $Ar_{11}$ represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamide or arylamide group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{11}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion and sulfinate ion are preferred in view of stability.

In formula (RI-II), $Ar_{21}$ and $Ar_{22}$ each independently represents an aryl group having 20 or less carbon atoms, which may have from 1 to 6 substituent(s), and preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{21}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, perchlorate ion, hexafluorophosphate ion, tetrafluoroborate ion, sulfonate ion, sulfinate ion and carboxylate ion are preferred in view of stability and reactivity.

In formula (RI-III), $R_{31}$, $R_{32}$ and $R_{33}$ each independently represents an aryl, alkyl, alkenyl or alkynyl group having 20 or less carbon atoms, which may have from 1 to 6 substituent(s), and in view of reactivity and stability, preferably an aryl group. Examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms. $Z_{31}^-$ represents a monovalent anion and specific examples thereof include halogen ion, perchlorate ion, hexafluorophosphate ion, tetrafluoroborate ion, sulfonate ion, sulfinate ion, thiosulfonate ion and sulfate ion. Among these, preferred in view of stability and reactivity are perchlorate ion, hexafluorophosphate ion, tetrafluoroborate ion, sulfonate ion, sulfinate ion and carboxylate ion, more preferred is carboxylate ion described in JP-A-2001-343742, still more preferred is carboxylate ion described in JP-A-2002-148790.

Specific examples of the onium salts represented by formulae (RI-I) to (RI-III) are set forth below, but the present invention is not limited thereto.

(N-1)

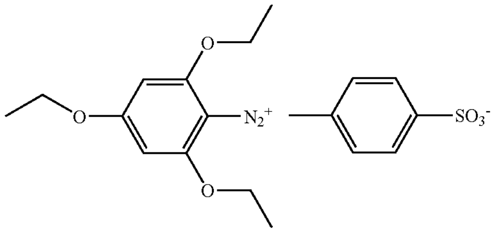

(N-2)

$PF_6^-$ (N-3)

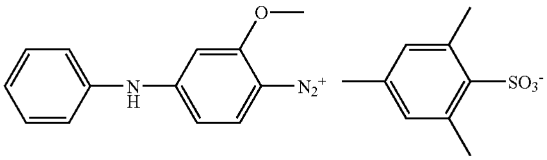

(N-4)

$ClO_4^-$ (N-5)

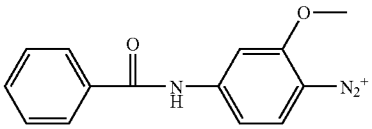 $CF_3SO_3^-$ (N-6)

$BF_4^-$

-continued (N-7)

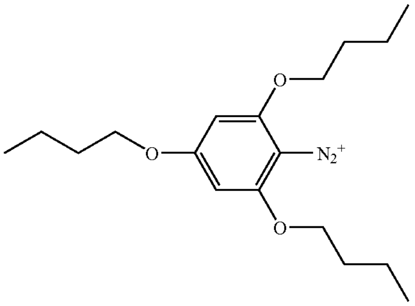

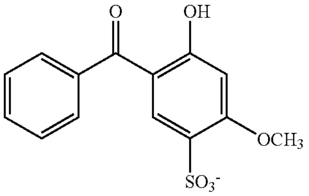

(N-8)

$ClO_4^-$ (N-9)

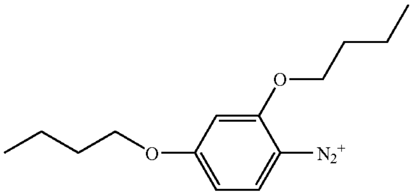

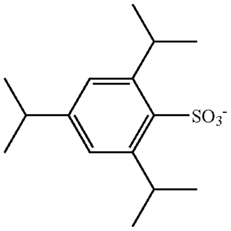

(N-10)

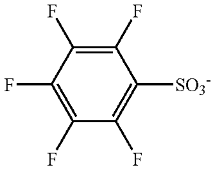

(N-11)

$PF_6^-$ (N-12)

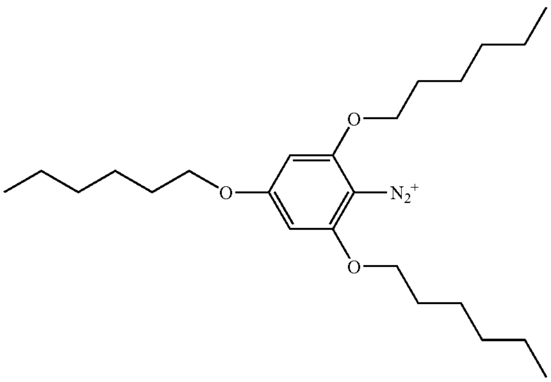

-continued
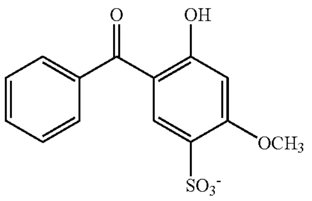
(N-13)
$ClO_4^-$
(N-14)
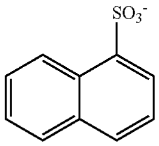
(I-1)
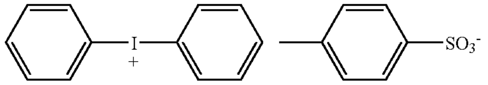
(I-2)
$PF_6^-$
(I-3)
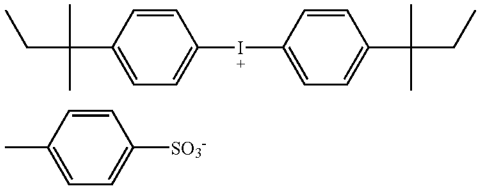
(I-4)
$ClO_4^-$
(I-5)
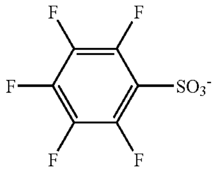
(I-6)
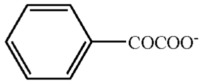
(I-7)
$CF_3SO_3^-$
(I-8)
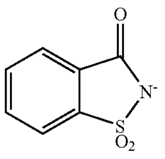
(I-9)
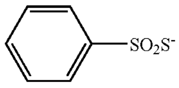
(I-10)
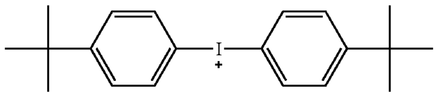
-continued
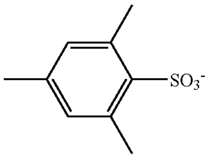
(I-11)
$ClO_4^-$
(I-12)
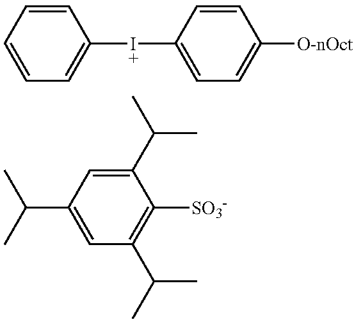
(I-13)
$CF_3COO^-$
(I-14)
$CF_3SO_3^-$
(I-15)
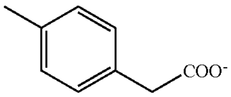
(I-16)
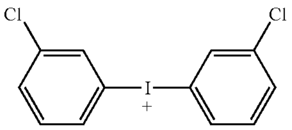
$BF_4^-$
(I-17)
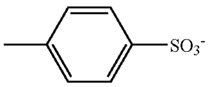
(I-18)
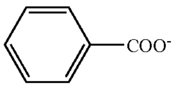
(S-1)
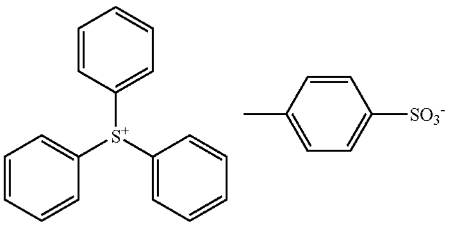
(S-2)
$PF_6^-$
(S-3)
$ClO_4^-$
(S-4)
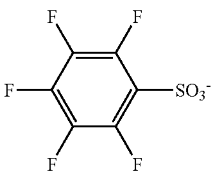

-continued (S-5)

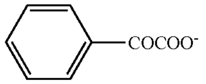

(S-6)

$CF_3SO_3^-$ (S-7)

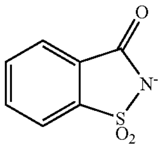

(S-8)

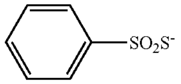

(S-9)

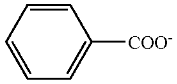

(S-10)

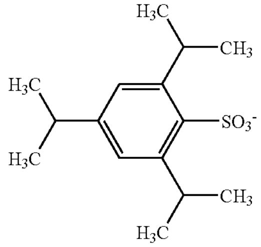

(S-11)

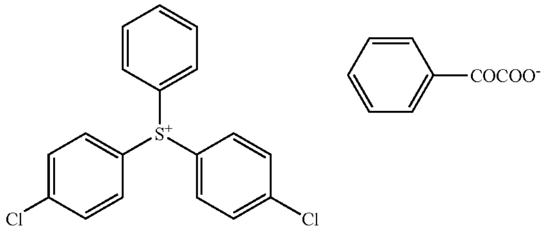

(S-12)

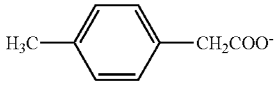

(S-13)

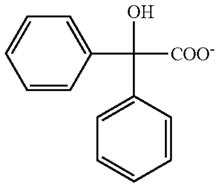

(S-14)

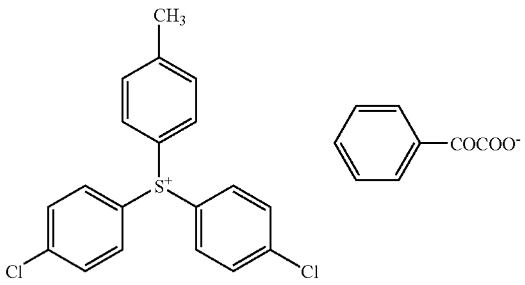

-continued (S-15)

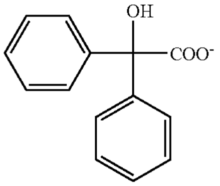

(S-16)

$BF_4^-$ (S-17)

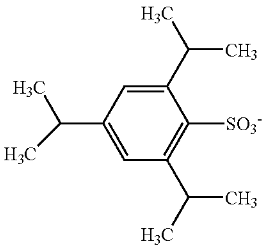

(S-18)

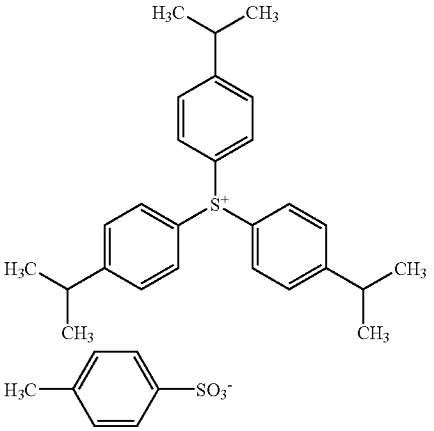

The radical polymerization initiator can be added at a ratio of 0.1 to 50 mass %, preferably from 0.5 to 30 mass %, more preferably from 1 to 20 mass %, based on all solid contents constituting the layer to which the radical polymerization initiator is added. Within this range, press life is more enhanced. One of these radical polymerization initiators may be used alone, or two or more thereof may be used in combination. Also, the radical polymerization initiator may be added together with other components in the same layer or may be added to a layer separately provided.

<Radical Polymerizable Compound>

The radical polymerizable compound (hereinafter sometimes simply referred to as a "polymerizable compound") which can be used in the present invention is an addition-polymerizable compound having at least one ethylenically unsaturated double bond and is selected from compounds having at least one, preferably two or more, ethylenically unsaturated bond(s). Such compounds are widely known in this industrial field and these known compounds can be used in the present invention without any particular limitation. In the present invention, the radical polymerizable compound means not only a mere monomer but also a prepolymer (that is, dimer, trimer or oligomer) or a mixture or copolymer thereof. Examples of the monomer and its copolymer include unsaturated carboxylic acids (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, addition reaction products of an unsaturated carboxylic acid ester or amide having a nucleophilic substituent such as hydroxyl group, amino group or mercapto group with a monofunctional or polyfunctional isocyanate or epoxy, and dehydrating condensation reaction products with a monofunctional or polyfunctional carboxylic acid may be suitably used. Furthermore, addition reaction products of an unsaturated carboxylic acid ester or amide having an electrophilic substituent such as isocyanate group or epoxy group with a monofunctional or polyfunctional alcohol, amine or thiol, and displacement reaction products of an unsaturated carboxylic acid ester or amide having a desorptive substituent such as halogen group or tosyloxy group with a monofunctional or polyfunctional alcohol, amine or thiol may also be suitably used. In addition, compounds where the unsaturated carboxylic acid of the above-described compounds is replaced by an unsaturated phosphonic acid, styrene, vinyl ether or the like, may also be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer and isocyanuric acid EO-modified triacrylate.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)-phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of the crotonic acid ester include ethylene glycol dicrotonate, tetramethylene glycol dicrotonate, pentaerythritol dicrotonate and sorbitol tetradicrotonate. Examples of the isocrotonic acid ester include ethylene glycol diisocrotonate, pentaerythritol diisocrotonate and sorbitol tetraisocrotonate. Examples of the maleic acid ester include ethylene glycol dimaleate, triethylene glycol dimaleate, pentaerythritol dimaleate and sorbitol tetramaleate.

Other examples of the ester include aliphatic alcohol-based esters described in JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide. Other preferred examples of the amide-type monomer include those having a cyclohexylene structure described in JP-B-54-21726.

A urethane-based addition-polymerizable compound produced by using an addition reaction of isocyanate with a hydroxyl group is also preferred and specific examples thereof include vinyl urethane compounds having two or more polymerizable vinyl groups within one molecule described in JP-B-48-41708, which are obtained by adding a vinyl monomer having a hydroxyl group represented by the following formula (a) to a polyisocyanate compound having two or more isocyanate groups within one molecule:

$$CH_2{=}C(R_4)COOCH_2CH(R_5)OH \qquad (a)$$

(wherein $R_4$ and $R_5$ each represents H or $CH_3$).

Also, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used. Furthermore, when addition-polymerizable compounds having an amino or sulfide structure within the molecule described in JP-A-63-277653, JP-A-63-260909 and JP-A-1-105238 are used, a photopolymerizable composition having very excellent photosensitization speed can be obtained.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-based compounds described in JP-A-2-25493 may be used. In some cases, structures containing a perfluoroalkyl group described in JP-A-61-22048 are suitably used. Furthermore, those described as a photocurable monomer or oligomer in *Adhesion,* Vol. 20, No. 7, pp. 300–308 (1984) may also be used.

Details of the use method of these addition-polymerizable compounds, such as structure, sole or combination use and amount added, can be freely selected in accordance with the designed performance of the final lithographic printing plate precursor and, for example, may be selected from the following standpoints.

In view of sensitivity, a structure having a large unsaturated group content per one molecule is preferred and in most cases, a bifunctional or greater functional compound is preferred. For increasing the strength of image area, namely, cured layer, a trifunctional or greater functional compound is preferred. Also, a method of controlling both sensitivity and strength by using a combination of compounds differing in the functional number or in the polymerizable group (for example, an acrylic acid ester, a methacrylic acid ester, a styrene-based compound or a vinyl ether-based compound) is effective.

The selection and use method of the addition-polymerizable compound are important factors also for the compatibility and dispersibility with other components (e.g., binder polymer, initiator, colorant) in the image forming layer. For example, the compatibility may be improved in some cases by using a low purity compound or using two or more compounds in combination. Also, a specific structure may be selected for the purpose of improving the adhesion to the substrate, protective layer which is described later, or the like.

The polymerizable compound is preferably used in an amount of 5 to 80 mass %, more preferably from 25 to 75 mass %, based on the entire solid content of the layer to which the polymerizable compound is added. Also, these polymerizable compounds may be used individually or in combination of two or more thereof. Other than these in the use method of the addition-polymerizable compound, an appropriate structure, formulation or amount added can be freely selected by taking account of the degree of polymerization inhibition due to oxygen, resolution, fogging, change in refractive index, surface tackiness and the like. Depending on the case, a layer structure or coating method such as undercoat and overcoat can also be employed.

<Infrared Absorbent>

In the present invention, an infrared absorbent is preferably used in combination with the compound represented by formula (1) or the radical polymerization initiator so as to enhance the sensitivity when the imagewise exposure is performed by using a light source of emitting an infrared ray. The infrared absorbent generally has a function of converting the absorbed infrared ray into heat and by the effect of heat generated here, the polymerization initiator thermally decomposes to generate a radical. The infrared absorbent for use in the present invention is a dye or pigment having an absorption maximum at a wavelength of 760 to 1,200 nm.

As for the dye, commercially available dyes and known dyes described in publications, for example, *Senryo Binran* (*Handbook of Dyes*), compiled by Yuki Gosei Kagaka Kyokai (1970), may be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt and metal thiolate complex.

Preferred examples of the dye include cyanine dyes described in JP-A-58-125246, JP-A-59-84356 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, near infrared absorbing sensitizers described in U.S. Pat. No. 5,156,938 may be suitably used. Furthermore, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiapyrylium salts described in U.S. Pat. No. 4,283,475, and pyrylium compounds described in JP-B-5-13514 and JP-B-5-19702 may also be preferably used. Other preferred examples of the dye include near infrared absorbing dyes represented by formulae (I) and (II) of U.S. Pat. No. 4,756,993.

Among these dyes, particularly preferred are cyanine dyes, squarylium dyes, pyrylium salts, nickel thiolate complexes and indolenine cyanine dyes, more preferred are cyanine dyes and indolenine cyanine dyes, still more preferred is a cyanine dye represented by the following formula (3):

Formula (3):

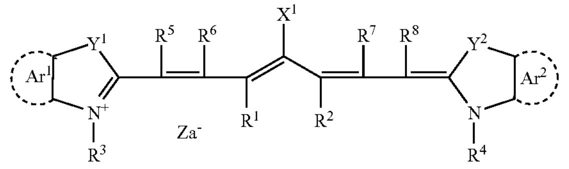

In formula (3), $X^1$ represents a hydrogen atom, a halogen atom, —$NPh_2$, $X^2$-$L^1$ or a group shown below (wherein $X^2$ represents an oxygen atom, a nitrogen atom or a sulfur atom, $L^1$ represents a hydrocarbon group having from 1 to 12 carbon atoms, an aromatic ring having a heteroatom, or a hydrocarbon group having from 1 to 12 carbon atoms and containing a heteroatom (the heteroatom as used herein indicates N, S, O, a halogen atom or Se), $X_a^-$ has the same definition as $Za^-$ described later, and $R^a$ represents a substituent selected from a hydrogen atom, an alkyl group, an aryl group, a substituted or unsubstituted amino group and a halogen atom):

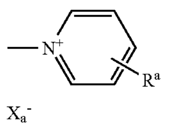

$R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 to more carbon atoms, and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring. Preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms, and in view of availability of the raw material, preferably a hydrogen atom. $Za^-$ represents a counter anion, but when the cyanine dye represented by formula (3) has an anionic substituent in its structure and neutralization of electric charge is not necessary, $Za^-$ is not present. In view of storage stability of the coating solution for the recording layer, $Za^-$ is preferably halogen ion, perchlorate ion, tetrafluoroborate ion, hexafluorophosphate ion or sulfonate ion, more preferably perchlorate ion, hexafluorophosphate ion or arylsulfonate ion.

Specific examples of the cyanine dye represented by formula (3), which can be suitably used in the present invention, include those described in paragraphs [0017] to [0019] of JP-A-2001-133969.

Other preferred examples include specific indolenine cyanine dyes described in JP-A-2002-278057.

As for the pigment used in the present invention, commercially available pigments and pigments described in *Color Index* (*C.I.*) *Binran* (*C.I. Handbook*), *Saishin Ganryo Binran* (*Handbook of Newest Pigments*), compiled by Nippon Ganryo Gijutsu Kyokai (1977), *Saishin Ganryo Oyo Gijutsu* (*Newest Pigment Application Technology*), CMC Shuppan (1986), and *Insatsu Ink Gijutsu* (*Printing Ink Technology*), CMC Shuppan (1984) can be used.

The kind of pigment includes black pigment, yellow pigment, orange pigment, brown pigment, red pigment, violet pigment, blue pigment, green pigment, fluorescent pigment, metal powder pigment and polymer bond dye. Specific examples of the pigment which can be used include insoluble azo pigments, azo lake pigments, condensed azo pigments, chelate azo pigments, phthalocyanine-based pigments, anthraquinone-based pigments, perylene- or perynone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments and carbon black. Among these pigments, carbon black is preferred.

These pigments may or may not be surface-treated before use. Examples of the method for surface treatment include a method of coating the surface with resin or wax, a method of attaching a surfactant, and a method of bonding a reactive substance (for example, a silane coupling agent, an epoxy compound or an isocyanate) to the pigment surface. These surface-treating methods are described in *Kinzoku Sekken no Seishitsu to Oyo* (*Properties and Application of Metal Soap*), Saiwai Shobo, *Insatsu Ink Gijutsu* (*Printing Ink Technology*), CMC Shuppan (1984), and *Saishin Ganryo Oyo Gijutsu* (*Newest Pigment Application Technology*), CMC Shuppan (1986).

The particle diameter of the pigment is preferably from 0.01 to 10 aim, more preferably from 0.05 to 1 μm, still more preferably from 0.1 to 1 μm. Within this range, good stability of the pigment dispersion in the coating solution for the image forming layer and good uniformity of the image forming layer can be obtained.

As for the dispersion method of the pigment, known dispersion techniques used in the production of ink or toner may be used. Examples of the dispersing machine include ultrasonic disperser, sand mill, attritor, pearl mill, super-mill, ball mill, impeller, disperser, KD mill, colloid mill, dynatron, three-roll mill and pressure kneader. These are described in detail in *Saishin Ganryo Oyo Gijutsu* (*Newest Pigment Application Technology*), CMC Shuppan (1986).

The infrared absorbent is preferably added to the image forming layer in a required minimum amount so as to prevent a side reaction of inhibiting the polymerization.

The infrared absorbent can be added at a ratio of 0.001 to 50 mass %, preferably from 0.005 to 30 mass %, more preferably from 0.01 to 10 mass %, based on the entire solid content of the image forming layer. Within this range, high sensitivity can be obtained without causing adverse effect on the uniformity or film strength of the image forming layer.

<Acid Generator>

In the layer containing the compound represented by formula (1) for use in the image forming material of the present invention, an acid generator is preferably further added. By adding an acid generator, the decomposition of the compound represented by formula (1) is accelerated.

The acid generator used in the present invention is a compound of generating an acid by the effect of light or heat, and examples thereof include the compounds described in JP-A-10-282644 (paragraphs [0039] to [0063]).

Specific examples thereof include onium salts such as diazonium salts described in S. I. Schlesinger, *Photogr. Sci. Eng.,* 18, 387 (1974), T. S. Bal et al., *Polymer,* 21, 423 (1980), etc., ammonium salts described in U.S. Pat. Nos. 4,069,055 and 4,069,056, JP-A-3-140140, etc., phosphonium salts described in D. C. Necker et al., *Macromolecules,* 17, 2468 (1984), C. S. Wen et al., *Teh, Proc. Conf. Rad. Curing ASIA,* page 478, Tokyo, October (1988), U.S. Pat. Nos. 4,069,055 and 4,069,056, etc., iodonium salts described in J. V. Crivello et al., *Macromolecules,* 10 (6) 1307 (1977), *Chem. & Eng. News,* Nov. 28, page 31 (1988), European Patents 104,143, 339,049 and 410,201, JP-A-2-150848, JP-A-2-296514, etc., sulfonium salts described in J. V. Crivello et al., *Polymer J.,* 17, 73 (1985), J. V. Crivello et al., *J. Org. Chem.,* 43, 3055 (1978), W. R. Watt et al., *J. Polymer Sci.,* Polymer Chem. Ed., 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci.,* Polymer Chem. Ed., 17, 2877 (1979), European Patent 370,693, U.S. Pat. No. 3,902,114, European Patents 233,567, 297,443 and 297,442, U.S. Pat. Nos. 4,933,377, 410,201, 339,049, 4,760,013, 4,734,444 and 2,833,827, German Patents 2,904,626, 3,604,580 and 3,604,581, etc., selenonium salts described in J. V. Crivello et al., *Macromolecules,* 10 (6), 1307 (1977), J. V. Crivello et al., *J. Polymer Sci*., Polymer Chem. Ed., 17, 1047 (1979), etc., and arsonium salts described in C. S. Wen et al., *Teh. Proc. Conf Rad. Curing ASIA,* page 478, Tokyo, October (1988), etc.; organohalogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halides described in K. Meier et al., *J. Rad. Curing,* 13 (4), 26 (1986), T. P. Gill et al., *Inorg. Chem.,* 19, 3007 (1980), D. Astruc, *Acc. Chem. Res.,* 19 (12), 377 (1896), JP-A-2-161445, etc.; photoacid generators having an o-nitrobenzyl type protective group described in S. Hayase et al., *J. Polymer Sci.,* 25, 753 (1987), E. Reichmanis et al., *J. Polymer Sci*., Polymer Chem. Ed., 23, 1 (1985), Q. Q. Zhu et al., *J. Photochem.,* 36, 85, 39, 317 (1987), B. Amit et al:, *Tetrahedron Lett., (*24) 2205 (1973), D. H. R. Barton et al., *J. Chem. Soc.,* 3571 (1965), P. M. Collins et al., *J. Chem. Soc*., Perkin I, 1695 (1975), M. Rudinstein et al., *Tetrahedron Lett*., (17), 1445 (1975), J. W. Walker et al., *J. Am. Chem. Soc.,* 110, 7170 (1988), S. C. Busman et al., *J. Imaging Technol.,* 11 (4), 191 (1985), H. M. Houlihan et al., *Macromolecules,* 21, 2001 (1988), P. M. Collins et al., *J. Chem. Commun.,* 532 (1972), S. Hayase et al., *Macromolecules,* 18, 1799 (1985), E. Reichmanis et al., *J. Electrochem. Soc., Solid State Sci. Technol.,* 130 (6), F. M. Houlihan et al., *Macromolecules,* 21, 2001 (1988), European Patents 0,290,750, 046,083, 156,535, 271,851 and 0,388,343, U.S. Pat. Nos. 3,901,710 and 4,181,531, JP-A-60-198538, JP-A-53-133022, etc.; compounds of photochemically decomposing to generate a sulfonic acid, as represented by iminosulfonate and the like, described in M. TUNOOKA et al., *Polymer Preprints Japan,* 35 (8), G.

Berner et al., *J. Rad. Curing,* 13 (4), W. J. Mijs et al., *Coating Technol.,* 55 (697), 45 (1983), Akzo, H. Adachi et al., *Polymer Preprints. Japan,* 37 (3), European Patents 0,199,672, 84,515, 199,672, 044,115 and 0,101,122, U.S. Pat. Nos. 4,618,564, 4,371,605 and 4,431,774, JP-A-64-18143, JP-A-2-245756, JP-A-4-365048, etc.; disulfone compounds described in JP-A-61-166544, etc.; o-naphthoquinonediazide-4-sulfonic acid halides described in JP-A-50-36209 (corresponding to U.S. Pat. No. 3,969,118); and o-naphthoquinonediazide compounds described in JP-A-55-62444 (corresponding to British Patent 2,038,801.

Other examples of the acid generator which can be used include cyclohexyl citrate, sulfonic acid alkyl esters such as cyclohexyl p-acetaminobenzenesulfonate and cyclohexyl p-bromobenzenesulfonate, and alkylsulfonic acid esters represented by the following structural formulae:

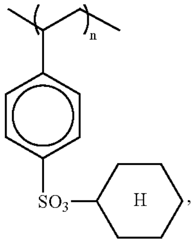
,
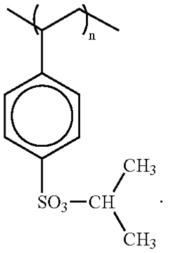
.

Among these compounds of decomposing under heat or upon irradiation with radiation to generate an acid, particularly effective compounds are described below.

(1) Oxazole derivative represented by the following formula (PAG1) and S-triazine derivative represented by formula (PAG2), each substituted by trihalomethyl group:

(PAG1)

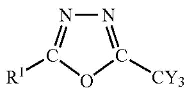

(PAG2)

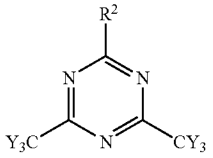

wherein $R^1$ represents a substituted or unsubstituted aryl group or a substituted or unsubstituted alkenyl group, $R^2$ represents a substituted or unsubstituted aryl group, a substituted or unsubstituted alkenyl group, a substituted or unsubstituted alkyl group or $-CY_3$, and Y represents a chlorine atom or a bromine atom. Specific examples thereof include, but are not limited to, the following compounds.

(PAG1-1)

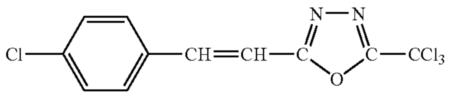

-continued (PAG1-2)

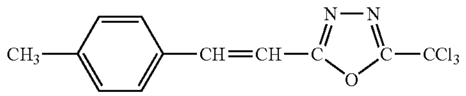

(PAG2-1)

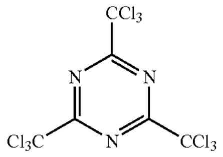

(PAG2-2)

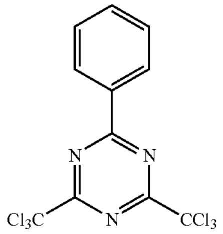

(PAG2-2)

(PAG2-3)

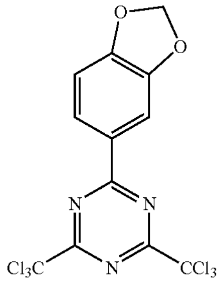

(PAG2-4)

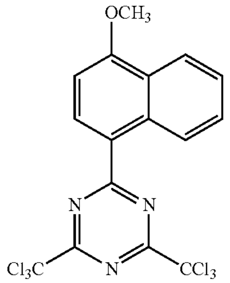

(PAG2-5)

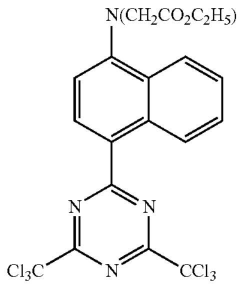

(2) Iodonium salt represented by the following formula (PAG3), sulfonium salt represented by formula (PAG4) and diazonium salt:

(PAG3)

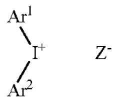

(PAG4)

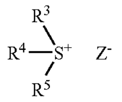

In these formulae, $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^3$, $R^4$ and $R^5$ each independently represents a substituted or unsubstituted alkyl group or a substituted or unsubstituted aryl group, preferably an aryl group having from 6 to 14 carbon atoms, an alkyl group having from 1 to 8 carbon atoms, or a substitution derivative thereof Preferred examples of the substituent for the aryl group include an alkoxy group having from 1 to 8 carbon atoms, an alkyl group having from 1 to 8 carbon atoms, a nitro group, a carboxyl group, a hydroxy group and a halogen atom, and preferred examples of the substituent for the alkyl group include an alkoxy group having from 1 to 8 carbon atoms, a carboxyl group and an alkoxycarbonyl group.

Two of $R^3$, $R^4$ and $R^5$, or $Ar^1$ and $Ar^2$ may combine through a single bond or a substituent.

$Z^-$ represents a counter anion and examples thereof include, but are not limited to, $BF_4^-$, $AsF_6^-$, $PF_6^-$, $SbF_6^-$, $SiF_6^{2-}$, $ClO_4^-$, perfluoroalkanesulfonate anion (e.g., $CF_3SO_3^-$, $C_4F_9SO_3^-$), pentafluorobenzenesulfonate anion, bonded polynuclear aromatic sulfonate anion (e.g., naphthalene-1-sulfonate anion), anthraquinonesulfonate anion and sulfonic acid group-containing dyes.

Specific examples of these onium salts include, but are not limited to, the following compounds:

(PAG3-1)

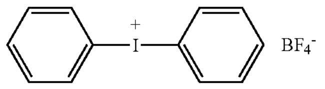

(PAG3-2)

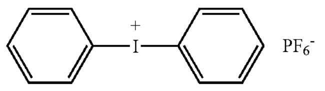

(PAG4-1)

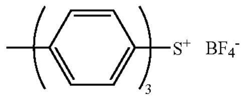

(PAG4-2)

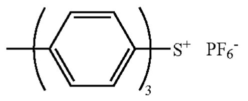

(PAG4-3)

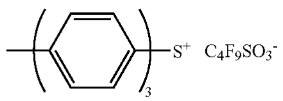

The above-described onium salts represented by formulae (PAG3) and (PAG4) are known and can be synthesized by the method described, for example, in J. W. Knapczyk et al., *J. Am. Chem. Soc.,* 91, 145 (1969), A. L. Maycok et al., *J. Org. Chem.,* 35, 2532 (1970), B. Goethas et al., *Bull. Soc. Chem. Belg.,* 73, 546 (1964), H. M. Leicester, *J. Ame. Chem. Soc.,* 51, 3587 (1929), J. V. Crivello et al., *J. Polym. Chem. Ed.,* 18, 2677 (1980), U.S. Pat. Nos. 2,807,648 and 4,247,473, and JP-A-53-101331.

(3) Disulfone derivative represented by the following formula (PAG5) and iminosulfonate derivative represented by formula (PAG6):

$Ar^3—SO_2—SO_2—Ar^4$ (PAG5)

(PAG6)

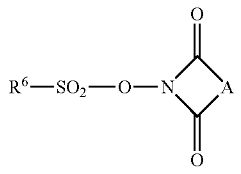

In these formulae, $Ar^3$ and $Ar^4$ each independently represents a substituted or unsubstituted aryl group, $R^6$ represents a substituted or unsubstituted alkyl group or a substituted or unsubstituted aryl group, and A represents a substituted or unsubstituted alkylene group, a substituted or unsubstituted alkenylene group or a substituted or unsubstituted arylene group.

Specific examples thereof include, but are not limited to, the following compounds:

(PAG5-1)

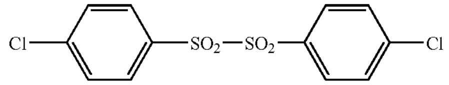

(PAG5-2)

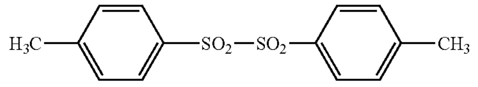

(PAG6-1)

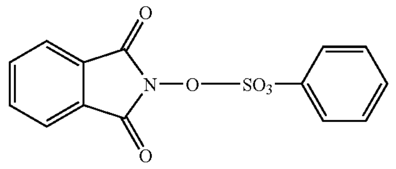

(PAG6-2)

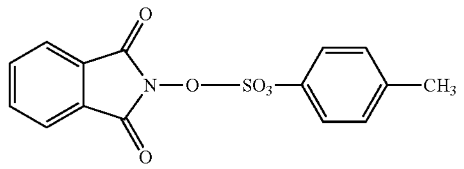

The amount of the acid generator used is usually from 0.1 to 50 mass %, preferably from 1 to 40 mass %, based on the entire solid content of the image forming layer. Within this range, sufficiently high sensitivity and good image strength are obtained.

<Other Components of Image Forming Layer>

In addition to the above-described components, the image forming layer of the present invention may contain additives, if desired, such as binder polymer, surfactant, colorant, polymerization inhibitor, higher fatty acid derivative, plasticizer, inorganic fine particle and low molecule hydrophilic compound. These additives are described below.

<Binder Polymer>

The image forming layer may contain a binder polymer. As for the binder polymer which can be used in the present invention, conventionally known binder polymers can be used without limitation and a linear organic polymer having a film property is preferred. Examples of such a binder polymer include acrylic resin, polyvinyl acetal resin, polyurethane resin, polyurea resin, polyimide resin, polyamide resin, epoxy resin, methacrylic resin, polystyrene-based resin, novolak-type phenol-based resin, polyester resin, synthetic rubber and natural rubber.

The binder polymer preferably has crosslinking property so as to enhance the film strength in the image area. The crosslinking property may be imparted to the binder polymer by introducing a crosslinking functional group such as ethylenically unsaturated bond into the main or side chain of the polymer. The crosslinking functional group may be introduced by copolymerization.

Examples of the polymer having an ethylenically unsaturated bond in the main chain of the molecule include poly-1,4-butadiene and poly-1,4-isoprene.

Examples of the polymer having an ethylenically unsaturated bond in the side chain of the molecule include polymers which are a polymer of acrylic or methacrylic acid ester or amide and in which the ester or amide residue (R in —COOR or CONHR) has an ethylenically unsaturated bond.

Examples of the residue (R above) having an ethylenically unsaturated bond include $—(CH_2)_nCR^1{=}CR^2R^3$, $—(CH_2O)_nCH_2CR^1{=}CR^2R^3$, $—(CH_2CH_2O)_nCH_2CR^1{=}CR^2R^3$, $—(CH_2)_nNH—CO—O—CH_2CR^1{=}CR^2R^3$, $—(CH_2)_n—O—CO—CR^1{=}CR^2R^3$ and $(CH_2CH_2O)_2—X$ (wherein $R^1$ to $R^3$ each represents a hydrogen atom, a halogen atom or an alkyl, aryl, alkoxy or aryloxy group having from 1 to 20 carbon atoms, $R^1$ and $R^2$ or $R^3$ may combine with each other to form a ring, n represents an integer of 1 to 10, and X represents a dicyclopentadienyl residue).

Specific examples of the ester residue include $—CH_2CH{=}CH_2$ (described in JP-B-7-21633), $—CH_2CH_2O—CH_2CH{=}CH_2$, $—CH_2C(CH_3){=}CH_2$, $—CH_2CH{=}CH—C_6H_5$, $—CH_2CH_2OCOCH{=}CH—C_6H_5$, $—CH_2CH_2—NHCOO—CH_2CH{=}CH_2$ and $CH_2CH_2O—X$ (wherein X represents a dicyclopentadienyl residue).

Specific examples of the amide residue include $—CH_2CH{=}CH_2$, $—CH_2CH_2—Y$ (wherein Y represents a cyclohexene residue) and $—CH_2CH_2—OCO—CH{=}CH_2$.

In the binder polymer having a crosslinking property, for example, a free radical (a polymerization initiating radical or a radical grown in the process of polymerization of a polymerizable compound) is added to the crosslinking functional group to cause addition-polymerization between polymers directly or through a polymerization chain of the polymerizable compound, as a result, crosslinking is formed between polymer molecules and thereby curing is effected. Alternatively, an atom (for example, a hydrogen atom on the carbon atom adjacent to the functional crosslinking group) in the polymer is withdrawn by a free radical to produce a polymer radical and the polymer radicals combine with each other to form crosslinking between polymer molecules, thereby effecting curing.

The content of the crosslinking group (content of radical-polymerizable unsaturated double bond determined by iodine titration) in the binder polymer is preferably from 0.1 to 10.0 mmol, more preferably from 1.0 to 7.0 mmol, most preferably from 2.0 to 5.5 mmol, per g of the binder polymer. Within this range, good sensitivity and good storage stability can be obtained.

From the standpoint of enhancing the on-press developability, the binder polymer preferably has high solubility or dispersibility for an ink and/or a fountain solution.

The binder polymer is preferably lipophilic for enhancing the solubility or dispersibility for ink, and preferably hydrophilic for enhancing the solubility or dispersibility for a fountain solution. Therefore, in the present invention, it is also effective to use a lipophilic binder polymer and a hydrophilic binder polymer in combination.

Preferred examples of the hydrophilic binder polymer include those having a hydrophilic group such as hydroxy group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonic acid group and phosphoric acid group.

Specific examples thereof include gum arabic, casein, gelatin, starch derivatives, carboxymethyl cellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetates having a hydrolysis degree of 60 mol % or more, preferably 80 mol % or more, polyvinyl formal, polyvinyl butyral, polyvinylpyrrolidone, homopolymers and polymers of acrylamide, homopolymers and copolymers of methacrylamide, homopolymers and copolymers of N-methylolacrylamide, polyvinylpyrrolidone, alcohol-soluble nylons, and polyethers of 2,2-bis-(4-hydroxyphenyl)-propane with epichlorohydrin.

The binder polymer preferably has a weight average molecular weight of 5,000 or more, more preferably from 10,000 to 300,000. The number average molecular weight thereof is preferably 1,000 or more, more preferably from 2,000 to 250,000. The polydispersity (weight average molecular weight/number average molecular weight) is preferably from 1.1 to 10.

The binder polymer may be a random polymer, a block polymer or a graft polymer but is preferably a random polymer. Also, the binder polymers may be used individually or in combination of two or more thereof.

The binder polymer can be synthesized by a conventionally know method. Examples of the solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethylsulfoxide and water. These solvents are used individually or as a mixture of two or more thereof.

As for the radical polymerization initiator used in the synthesis of the binder polymer, known compounds such as azo-type initiator and peroxide initiator can be used.

The binder polymer content is preferably from 10 to 90 mass %, more preferably from 20 to 80 mass %, still more preferably from 30 to 70 mass %, based on the entire solid content of the image forming layer. Within this range, good strength of image area and good image-forming property can be obtained.

The polymerizable compound and the binder polymer are preferably used in amounts of giving a mass ratio of 1/9 to 7/3.

<Surfactant>

In the present invention, a surfactant is preferably used in the image forming layer so as to accelerate the on-press development at the initiation of printing and enhance the coated surface state. The surfactant includes a nonionic surfactant, an anionic surfactant, a cationic surfactant, an amphoteric surfactant, a fluorine-containing surfactant and the like. The surfactants may be used individually or in combination of two or more thereof.

The nonionic surfactant for use in the present invention is not particularly limited and conventionally known nonionic surfactants can be used. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylenated castor oils, polyoxyethylene glycerin fatty acid partial esters, fatty acid diethanolamides, N,N-bis-2-hydroxyalkylamines, polyoxyethylene alkylamines, triethanolamine fatty acid esters, trialkylamine oxides, polyethylene glycol, and copolymers of polyethylene glycol and polypropylene glycol.

The anionic surfactant for use in the present invention is not particularly limited and conventionally known anionic surfactants can be used. Examples thereof include fatty acid salts, abietates, hydroxyalkanesulfonates, alkanesulfonates, dialkylsulfosuccinic ester salts, linear alkylbenzenesulfonates, branched alkylbenzenesulfonates, alkylnaphthalenesulfonates, alkyl-phenoxypolyoxyethylenepropylsulfonates, polyoxyethylenealkylsulfophenyl ether salts, N-methyl-N-oleyltaurine sodium salts, monoamide disodium N-alkylsulfosuccinates, petroleum sulfonates, sulfated beef tallow oils, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenyl ether sulfuric ester salts, polyoxyethylene styrylphenyl ether sulfuric ester salts, alkylphosphoric ester salts, polyoxyethylene alkyl ether phosphoric ester salts, polyoxyethylene alkylphenyl ether phosphoric ester salts, partially saponified products of styrene/maleic anhydride copolymer, partially saponified products of olefin/maleic anhydride copolymer, and naphthalenesulfonate formalin condensates.

The cationic surfactant for use in the present invention is not particularly limited and conventionally known cationic surfactants can be used. Examples thereof include alkylamine salts, quaternary ammonium salts, polyoxyethylenealkylamine salts and polyethylene polyamine derivatives.

The amphoteric surfactant for use in the present invention is not particularly limited and conventionally known amphoteric surfactants can be used. Examples thereof include carboxybetaines, aminocarboxylic acids, sulfobetaines, aminosulfuric esters and imidazolines.

The term "polyoxyethylene" in the above-described surfactants can be instead read as "polyoxyalkylene" such as polyoxymethylene, polyoxypropylene and polyoxybutylene, and these surfactants can also be used in the present invention.

The surfactant is more preferably a fluorine-containing surfactant containing a perfluoroalkyl group within the molecule. This fluorine-containing surfactant includes an anionic type such as perfluoroalkylcarboxylate, perfluoroalkylsulfonate and perfluoroalkylphosphoric ester; an amphoteric type such as perfluoroalkylbetaine; a cationic type such as perfluoroalkyltrimethylammonium salt; and a nonionic type such as perfluoroalkylamine oxide, perfluoroalkyl ethylene oxide adduct, oligomer containing a perfluoroalkyl group and a hydrophilic group, oligomer containing a perfluoroalkyl group and a lipophilic group, oligomer containing a perfluoroalkyl group, a hydrophilic group and a lipophilic group, and urethane containing a perfluoroalkyl group and a lipophilic group. In addition, fluorine-containing surfactants described in JP-A-62-170950, JP-A-62-226143 and JP-A-60-168144 may also be suitably used.

The surfactants can be used individually or in combination of two or more thereof. The surfactant content is preferably from 0.001 to 10 mass %, more preferably from 0.01 to 7 mass %, based on the entire solid content of the image forming layer.

<Colorant>

In the present invention, various compounds may be further added, if desired, in addition to those described above. For example, a dye having large absorption in the visible light region can be used as a colorant for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A-62-293247. Also, pigments such as phthalocyanine-based pigment, azo-based pigment, carbon black and titanium oxide may be suitably used.

The colorant is preferably added, because the image area and the non-image area after image formation can be clearly distinguished. The amount of the colorant added is preferably from 0.01 to 10 mass % based on the entire solid content of the image forming layer.

<Polymerization Inhibitor>

In the image forming layer, a small amount of a thermopolymerization inhibitor is preferably added so as to prevent unnecessary thermopolymerization of the radical polymerizable compound during the production or storage of the image forming layer.

Suitable examples of the thermopolymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermopolymerization inhibitor added is preferably from about 0.01 to about 5 mass % based on the entire solid content of the image forming layer.

<Higher Fatty Acid Derivative, Etc.>

In the image forming layer, for example, a higher fatty acid derivative such as behenic acid or behenic acid amide may be added and localized on the surface of the image forming layer during drying after coating so as to prevent polymerization inhibition by oxygen. The amount of the higher fatty acid derivative added is preferably from about 0.1 to about 10 mass % based on the entire solid content of the image forming layer.

<Plasticizer>

The image forming layer may contain a plasticizer for enhancing the on-press developability.

Suitable examples of the plasticizer include phthalic acid esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate and diallyl phthalate; glycol esters such as dimethyl glycol phthalate, ethyl phthalylethyl glycolate, methyl phthalylethyl glycolate, butyl phthalylbutyl glycolate and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate.

The plasticizer content is preferably about 30 mass % or less based on the entire solid content of the image forming layer.

<Inorganic Fine Particle>

The image forming layer may contain an inorganic fine particle so as to elevate cured film strength in the image area and enhance the on-press developability of the non-image area.

Suitable examples of the inorganic fine particle include silica, alumina, magnesium oxide, titanium oxide, magnesium carbonate, calcium alginate and a mixture thereof. Even if such an inorganic fine particle has no light-to-heat converting property, it can be used, for example, for strengthening the film or roughening the surface to enhance the adhesion at the interface.

The average particle diameter of the inorganic fine particle is preferably from 5 nm to 10 μm, more preferably from 0.5 to 3 μm. Within this range, the inorganic particles are stably dispersed in the image forming layer, so that the image forming layer can maintain sufficiently high film strength and the non-image area formed can have excellent hydrophilicity of less causing scumming at printing.

Such an inorganic fine particle is easily available on the market as a colloidal silica dispersion or the like.

The inorganic fine particle content is preferably 20 mass % or less, more preferably 10 mass % or less, based on the entire solid content of the image forming layer.

<Low-Molecular Hydrophilic Compound>

The image forming layer may contain a hydrophilic low-molecular compound so as to enhance the on-press developability. Examples of the hydrophilic low-molecular compound include, as a water-soluble organic compound, glycols and ether or ester derivatives thereof, such as ethylene glycol, diethylene glycol, triethylene glycol, propylene glycol, dipropylene glycol and tripropylene glycol; polyhydroxys such as glycerin and pentaerythritol; organoamines and salts thereof, such as triethanolamine, diethanolamine and monoethanolamine; organosulfonic acids and salts thereof, such as toluenesulfonic acid and benzenesulfonic acid; organophosphonic acids and salts thereof, such as phenylphosphonic acid; and organocarboxylic acids and salts thereof, such as tartaric acid, oxalic acid, citric acid, malic acid, lactic acid, gluconic acid and amino acids.

<Formation of Image Forming Layer>

In the present invention, the method for incorporating these image forming layer-constituting components into the image forming layer includes several embodiments. One is an embodiment of dissolving those constituent components in an appropriate solvent and coating the obtained solution as described, for example, in JP-A-2002-287334, and another is an embodiment of enclosing the constituent components in a microcapsule and incorporating the microcapsule into the image forming layer (microcapsule-type image forming layer) as described, for example, in JP-A-2001-277740 and JP-A-2001-277742. In the microcapsule-type image forming layer, the constituent components may be incorporated also outside the microcapsule. In a preferred embodiment of the microcapsule-type image forming layer, hydrophobic constituent components are enclosed in a microcapsule and hydrophilic constituent components are incorporated outside the microcapsule.

It is a more preferred embodiment for obtaining good printout image and good press life to microencapsulate, out of the constituent components of the image forming layer, the compound represented by formula (1), or the compound represented by formula (1) and the compound of interacting with a thermal decomposition product of the compound and thereby changing in the color, together with the infrared absorbent, because the printout image-forming system and the printing image-forming reaction system can be separated and prevented from inhibiting each other's reactions.

For microencapsulating the constituent components of the image forming layer, known methods can be used. Examples of the method for producing a microcapsule include, but are not limited to, a method utilizing coacervation described in U.S. Pat. Nos. 2,800,457 and 2,800,458, a method utilizing interfacial polymerization described in U.S. Pat. No. 3,287,154, JP-B-38-19574 and JP-B-42-446, a method utilizing polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall-forming material described in U.S. Pat. Nos. 4,001,140, 4,087,376 and 4,089,802, a method using a wall material such as melamine-formaldehyde resin and hydroxy cellulose described in U.S. Pat. No. 4,025,445, an in situ method utilizing monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074.

The microcapsule wall for use in the present invention preferably has a three-dimensionally crosslinked structure and has a property of swelling with a solvent. From this standpoint, the wall material of microcapsule is preferably polyurea, polyurethane, polyester, polycarbonate, polyamide or a mixture thereof, more preferably polyurea or polyurethane. Also, the above-described compound having a crosslinking functional group such as ethylenically unsaturated bond, which can be introduced into the binder polymer, may be introduced into the microcapsule wall.

The average particle diameter of the microcapsule is preferably from 0.01 to 3.0 μm, more preferably from 0.05 to 2.0 μm, still more preferably from 0.10 to 1.0 μm. Within this range, good resolution and good aging stability can be obtained.

The image forming layer is formed by dispersing or dissolving the above-described necessary components in a solvent to prepare a coating solution and coating the coating solution. Examples of the solvent used here include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyl lactone, toluene and water. These solvents are used individually or in combination. The solid content concentration of the coating solution is preferably from 1 to 50 mass %. The image forming layer may also be formed by dispersing or dissolving the same or different components described above in the same or different solvents to prepare a plurality of coating solutions and repeating the coating and drying multiple times.

The coated amount (solid content) of the image forming layer obtained on the support after coating and drying varies depending on the use but, in general, is preferably from 0.3 to 3.0 g/$m^2$. Within this range, good sensitivity and good film properties of the image recording layer can be obtained.

For the coating, various methods may be used and examples thereof include bar coater coating, rotary coating, spray coating, curtain coating, dip coating, air knife coating, blade coating and roll coating.

[Support]

The support for use in the image forming material of the present invention is not particularly limited and may be sufficient if it is a dimensionally stable plate-like material. In particular, the support of the lithographic printing plate precursor is preferably a surface-hydrophilic support. Examples of the support include paper, paper laminated with plastic (e.g., polyethylene, polypropylene, polystyrene), metal plate (e.g., aluminum, zinc, copper), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal), and paper or plastic film laminated or vapor-deposited with the above-described metal. Among these supports, polyester film and aluminum plate are preferred, and aluminum plate is more preferred because this is dimensionally stable and relatively inexpensive.

The aluminum plate is a pure aluminum plate, an alloy plate mainly comprising aluminum and containing trace heteroelements, or an aluminum or aluminum alloy thin film laminated with a plastic. Examples of the heteroelement contained in the aluminum alloy include silicon, iron, manganese, copper, magnesium, chromium, zinc, bismuth, nickel and titanium. The heteroelement content in the alloy is preferably 10 mass % or less. In the present invention, a pure aluminum plate is preferred, but perfectly pure aluminum is difficult to produce in view of refining technique and therefore, an aluminum plate containing trace heteroelements may be used. The aluminum plate is not particularly limited in its composition, and a conventionally known and commonly employed material can be appropriately used.

The thickness of the support is preferably from 0.1 to 0.6 mm, more preferably from 0.15 to 0.4 mm, still more preferably from 0.2 to 0.3 mm.

In advance of using the aluminum plate, the aluminum plate is preferably subjected to a surface treatment such as surface roughening and formation of hydrophilic film. By this surface treatment, it is facilitated to enhance hydrophilicity and ensure adhesion between the image forming layer and the support. Before surface-roughening, the aluminum plate is degreased for removing the rolling oil on the surface, if desired, by using a surfactant, an organic solvent, an alkaline aqueous solution or the like.

<Surface-Roughening Treatment>

The surface-roughening treatment of the aluminum plate surface is performed by various methods and examples thereof include a mechanical surface-roughening treatment, an electrochemical surface-roughening treatment (surface-roughening treatment of electrochemically dissolving the surface) and a chemical surface-roughening treatment (a surface-roughening treatment of chemically and selectively dissolving the surface).

The mechanical surface-roughening treatment may be performed by using a known method such as ball polishing, brush polishing, blast polishing and buff polishing.

The electrochemical surface-roughening treatment is performed, for example, by a method of passing an alternating or direct current in an electrolytic solution containing an acid such as hydrochloric acid or nitric acid. Also, a method using a mixed acid described in JP-A-54-63902 may be used.

<Formation of Hydrophilic Film>

The aluminum plate subjected to the surface-roughening treatment and, if desired, to other treatments is then subjected to a treatment for providing a hydrophilic film having a low thermal conductivity. The thermal conductivity in the thickness direction of the hydrophilic film is 0.05 W/mK or more, preferably 0.08 W/mK or more, and 0.5 W/mK or less, preferably 0.3 W/mK or less, more preferably 0.2 W/mK or less. When the thermal conductivity in the film thickness direction is from 0.05 to 0.5 W/mK, the heat generated in the image forming layer upon laser light exposure can be prevented from diffusing into the support. As a result, in the case of using the lithographic printing plate precursor of the present invention as an on-press development type or non-processing type, the heat generated upon laser exposure can be effectively used and the sensitivity is elevated, so that image formation and printout image formation can be satisfactorily attained.

The thermal conductivity in the thickness direction of the hydrophilic film as defined in the present invention is described below. As for the method of measuring thermal conductivity of thin film, various methods have been heretofore reported. In 1986, ONO et al. reported a thermal conductivity in the plane direction of thin film determined by using a thermograph. Also, attempts to apply an AC heating method to the measurement of thermal properties of thin film have been reported. The history of the AC heating method can be traced even to the report of 1863. In recent years, heating methods using a laser have been developed and various measuring methods utilizing combination with Fourier conversion have been proposed. In practice, devices using a laser angstrom method are commercially available. These methods all are to determine the thermal conductivity in the plane direction (in-plane direction) of thin film.

However, in considering the thermal conduction of thin film, the important factor is rather the thermal diffusion in the depth direction.

As reported in various papers, the thermal conductivity is not isotropic and particularly, in cases as in the present invention, it is very important to directly measure the thermal conductivity in the film thickness direction. From such a standpoint, a method using a thermal comparator has been reported in the paper by Lambropoulos et al. (*J. Appl. Phys.,* 66 (9) (November, 1989)) and the paper by Henager et al. (*APPLIED OPTICS,* Vol. 32, No. 1 (Jan. 1, 1993)) with an attempt to measure the thermal properties in the thickness direction of thin film. Furthermore, a method of measuring the thermal diffusivity of polymer thin film by temperature wave thermal analysis to which Fourier analysis is applied has been recently reported by Hashimoto et al. (*Netsu Sokutei* (*Heat Measurement*), 27 (3) (2000)).

The thermal conductivity in the thickness direction of hydrophilic film as defined in the present invention is measured by the above-described method using a thermal comparator. This method is specifically described below, but its fundamental principles are described in detail in those papers by Lambropoulos et al. and by Henager et al. In the present invention, the thermal conductivity is measured by the method described in JP-A-2003-103951 using the thermal comparator shown in FIG. 3 of the same patent publication.

The relationship between each temperature and thermal conductivity of film can be expressed by the following mathematical formula (1):

[Mathematical Formula1]

$$\frac{(T_r - T_b)}{(T_r - T_t)} = \left(\frac{4K_1 r_1}{K_{tf} A_3}\right)t + \left(1 + \left(\frac{4K_1 r_1}{K_2 A_2}\right)t_2 + \left(\frac{K_1 r_1}{K_4 r_1}\right)\right) \quad (1)$$

In mathematical formula (1), the symbols have the following meanings:

$T_r$: temperature at distal end of tip, $T_b$: heat sink temperature, $K_{tf}$: thermal conductivity of film, $K_1$: thermal conductivity of reserver, $K_2$: thermal conductivity of tip (in the case of oxygen-free copper, 400 W/mK), $K_4$: thermal conductivity of metal substrate (when film is not provided thereon), $r_1$: radius of curvature at distal end of tip, $A_2$: contact area between reserver and tip, $A_3$: contact area between tip and film, t: film thickness, and $t_2$: contact thickness (about 0).

By changing the film thickness (t) and measuring and plotting respective temperatures ($T_t$, $T_b$ and $T_r$), the gradient of formula (1) is determined, whereby the thermal conductivity of film ($K_{tf}$) can be determined. That is, as apparent from formula (1), this gradient is a value determined by the thermal conductivity of reserver ($K_1$), the radius of curvature at distal end of tip ($r_1$), the thermal conductivity of film ($K_{tf}$) and the contact area between tip and film ($A_3$) and since $K_1$, $r_1$ and $A_3$ are known values, the value of $K_{tf}$ can be determined from the gradient.

The present inventors determined the thermal conductivity of a hydrophilic film (anodic oxide film $Al_2O_3$) provided on an aluminum substrate by using the above-described measuring method. The temperatures were measured by changing the film thickness, as a result, the thermal conductivity of $Al_2O_3$ determined from the gradient of graph was 0.69 W/mK. This reveals good agreement with the results in the paper by Lambropoulos et al. This result also reveals that the thermal physical values of thin film differ from the thermal physical values of bulk (the thermal conductivity of bulk $Al_2O_3$ is 28 W/mK).

In the case of using the above-described method for the measurement of the thermal conductivity in the thickness direction of the hydrophilic film on the lithographic printing plate precursor of the present invention, it is preferred to use a tip with fine distal end and keep constant the pressing load, because non-fluctuated results can be obtained even on the surface roughened for use as a lithographic printing. The thermal conductivity is preferably determined as an average value by measuring the thermal conductivity at different multiple points on a sample, for example, at 5 points.

The thickness of the hydrophilic film is, in view of less scratching and press life, preferably 0.1 μm or more, more preferably 0.3 μm or more, still more preferably 0.6 μm or more. Also, from the standpoint of production cost, since a large energy is necessary for providing a thick film, the film thickness is preferably 5 μm or less, more preferably 3 μm or less, still more preferably 2 μm or less.

On taking account of effect on heat insulation and in view of film strength and less scumming at printing, the hydrophilic film preferably has a density of 1,000 to 3,200 $kg/m^3$.

As for the method of measuring the density, for example, the density can be calculated according to the following formula from the mass measured by Mason's method (anodic oxide film mass method by dissolution in a chromic acid/phosphoric acid mixed solution) and the film thickness determined by observing the cross section through SEM:

Density ($kg/m^3$)=(mass of hydrophilic film per unit area/film thickness)

The method for providing the hydrophilic film is not particularly limited and, for example, anodization, vapor deposition, CVD, sol-gel method, sputtering, ion plating or diffusion method can be appropriately used. Also, a method of coating a solution obtained by mixing hollow particles in a hydrophilic resin or sol-gel solution can be used.

Among these, a treatment of producing an oxide by anodization, that is, an anodization treatment is most preferred. The anodization treatment can be performed by a method conventionally employed in this field. Specifically, when DC or AC is passed to an aluminum plate in an aqueous or nonaqueous solution comprising a sulfuric acid, a phosphoric acid, a chromic acid, an oxalic acid, a sulfamic acid, a benzenesulfonic acid or the like individually or in combination of two or more thereof, an anodic oxide film which is a hydrophilic film can be formed on the surface of the aluminum plate. The conditions for the anodization treatment vary according to the electrolytic solution used and cannot be indiscriminately determined, but in general, suitable conditions are such that the electrolytic solution concentration is from 1 to 80 mass %, the liquid temperature is from 5 to 70° C., the current density is from 0.5 to 60 $A/dm^2$, the voltage is from 1 to 200 V and the electrolysis time is from 1 to 1,000 seconds. Among such anodization treatments, preferred are a method of performing the anodization treatment in a sulfuric acid electrolytic solution at a high current density described in British Patent 1,412,768 and a method of performing the anodization treatment by using a phosphoric acid as the electrolytic bath described in U.S. Pat. No. 3,511,661. Also, a multistage anodization treatment of performing the anodization treatment, for example, in a sulfuric acid and further in a phosphoric acid may be employed.

In the present invention, in view of less scratching and press life, the coverage of the anodic oxide film is preferably 0.1 $g/m^2$ or more, more preferably 0.3 $g/m^2$ or more, still more preferably 2 $g/m^2$ or more, yet still more preferably 3.2 $g/m^2$ or more, and since a large energy is necessary for providing a thick film, preferably 100 $g/m^2$ or less, more preferably 40 $g/m^2$ or less, still more preferably 20 $g/m^2$ or less.

On the surface of the anodic oxide film, fine recesses called a micropore are formed and evenly distributed. The density of micropores present in the anodic oxide film can be adjusted by appropriately selecting the treatment conditions. By elevating the density of micropores, the thermal conductivity in the thickness direction of the anodic oxide film can be made to be from 0.05 to 0.5 W/mK. Also, the micropore diameter can be adjusted by appropriately selecting the treatment conditions. By increasing the micropore diameter, the thermal conductivity in the thickness direction of the anodic oxide film can be made to be from 0.05 to 0.5 W/mK. The micropore diameter can also be adjusted by appropriately selecting the treatment conditions. By increasing the micropore diameter, the thermal conductivity in the thickness direction of the anodic oxide film can be made to be from 0.05 to 0.5 W/mK.

In the present invention, for the purpose of decreasing the thermal conductivity, a pore wide treatment of enlarging the pore diameter of micropores is preferably performed after the anodization treatment. In this pore wide treatment, the aluminum substrate having formed thereon the anodic oxide film is dipped in an aqueous acid solution or an aqueous alkali solution, as a result, the anodic oxide film is dissolved and the pore diameter of micropores is enlarged. The pore wide treatment is preferably performed to dissolve the anodic oxide film in an amount of 0.01 to 20 g/m2, more preferably from 0.1 to 5 $g/m^2$, still more preferably from 0.2 to 4 $g/m^2$.

In the case of using an aqueous acid solution for the pore wide treatment, an aqueous solution of an inorganic acid such as sulfuric acid, phosphoric acid, nitric acid or hydrochloric acid, or a mixture thereof is preferably used. The concentration of the aqueous acid solution is preferably from 10 to 1,000 g/L, more preferably from 20 to 500 g/L. The temperature of the aqueous acid solution is preferably from 10 to 90° C., more preferably from 30 to 70° C., and the dipping time in the aqueous acid solution is preferably from 1 to 300 seconds, more preferably from 2 to 100 seconds. On the other hand, in the case of using an aqueous alkali solution for the pore wide treatment, an aqueous solution of at least one alkali selected from the group consisting of sodium hydroxide, potassium hydroxide and lithium hydroxide is preferably used. The pH of the aqueous alkali solution is preferably from 10 to 13, more preferably from 11.5 to 13.0. The temperature of the aqueous alkali solution is preferably from 10 to 90° C., more preferably from 30 to 50° C., and the dipping time in the aqueous alkali solution is preferably from 1 to 500 seconds, more preferably from 2 to 100 seconds. However, if the mircopore diameter on the outermost surface is excessively enlarged, the antiscumming performance at printing deteriorates. The micropore diameter on the outermost surface is preferably made to be 40 nm or less, more preferably 20 nm or less, and most preferably 10 nm or less. Therefore, for ensuring both heat insulation and antiscumming performance, the anodic oxide film more preferably has a profile such that the surface micropore diameter is from 0 to 40 nm and the inner micropore diameter is from 20 to 300 nm. For example, when the electrolytic solution is the same kind, it is known that the pore diameter of pores produced by electrolysis is proportional to the electrolytic voltage at electrolysis. By utilizing this property, a method of gradually elevating the electrolytic voltage and thereby producing pores enlarged in the bottom portion can be used. It is also known that when the kind of the electrolytic solution is changed, the pore diameter changes. The pore diameter is larger in the order of sulfuric acid, oxalic acid and phosphoric acid. Accordingly, a method of performing anodization by using a sulfuric acid for the electrolytic solution in the first stage and using a phosphoric acid in the second stage can be used. The support obtained through anodization treatment and/or pore wide treatment may also be subjected to a pore-sealing treatment described later.

Other than the above-described anodic oxide film, the hydrophilic film may be an inorganic film provided by sputtering, CVD or the like. Examples of the compound constituting the inorganic film include an oxide, a nitride, a silicide, a boride and a carbide. The inorganic film may comprise only a simple compound or may comprise a compound mixture. Specific examples of the compound constituting the inorganic film include aluminum oxide, silicon oxide, titanium oxide, zirconium oxide, hafnium oxide, vanadium oxide, niobium oxide, tantalum oxide, molybdenum oxide, tungsten oxide, chromium oxide, aluminum nitride, silicon nitride, titanium nitride, zirconium nitride, hafnium nitride, vanadium nitride, niobium nitride, tantalum nitride, molybdenum nitride, tungsten nitride, chromium nitride, silicon nitride, boron nitride, titanium silicide, zirconium silicide, hafnium silicide, vanadium silicide, niobium silicide, tantalum silicide, molybdenum silicide, tungsten suicide, chromium silicide, titanium boride, zirconium boride, hafnium boride, vanadium boride, niobium boride, tantalum boride, molybdenum boride, tungsten boride, chromium boride, aluminum carbide, silicon carbide, titanium carbide, zirconium carbide, hafnium carbide, vanadium carbide, niobium carbide, tantalum carbide, molybdenum carbide, tungsten carbide, and chromium carbide.

<Pore-Sealing Treatment>

In the present invention, the hydrophilic support obtained, as described above, by providing a hydrophilic film may be subjected to a pore-sealing treatment. Examples of the pore-sealing treatment for use in the present invention include a pore-sealing treatment of an anodic oxide film by steam under pressure or hot water described in JP-A-4-176690 and JP-A-11-301135. Also, this treatment may be performed by using a known method such as silicate treatment, aqueous bichromate solution treatment, nitrite treatment, ammonium acetate salt treatment, electrodeposition pore-sealing treatment, triethanolamine treatment, barium carbonate treatment and treatment with hot water containing a very slight amount of phosphate. For example, when electrodeposition pore-sealing treatment is applied, the pore-sealed film is formed from the bottom of pore, and when steam pore-sealing treatment is applied, the pore-sealed film is formed from the top of pore. Depending on the pore-sealing treatment, the manner of forming the pore-sealed film differs. Other examples of the treatment include dipping in a solution, spraying, coating, vapor deposition, sputtering, ion plating, flame spray coating and plating, but the treating method is not particularly limited. In particular, a pore-sealing treatment using particles having an average particle size of 8 to 800 nm described in JP-A-2002-214764 is preferred.

The pore-sealing treatment using particles is performed by using particles having an average particle size of 8 to 800 nm, preferably from 10 to 500 nm, more preferably from 10 to 150 nm. Within this range, the particles can be hardly fitted into the inside of a micropore present in the hydrophilic film and sufficiently high effect of elevating the sensitivity, good adhesion to the image forming layer and excellent press life are ensured. The thickness of the particle layer is preferably from 8 to 800 nm, more preferably from 10 to 500 nm.

The particle for use in the present invention preferably has a thermal conductivity of 60 W/mK or less, more preferably 40 W/mK or less, still more preferably from 0.3 to 10 W/mK. When the thermal conductivity is 60 W/mK or less, the diffusion of heat into the aluminum substrate can be satisfactorily prevented and a sufficiently high effect of elevating the sensitivity is obtained.

Examples of the method for providing the particle layer include, but are not limited to, dipping in a solution, spraying, coating, electrolysis, vapor deposition, sputtering, ion plating, flame spray coating and plating.

In the electrolysis, DC or AC can be used. Examples of the waveform of AC for use in the electrolysis include sine wave, rectangular wave, triangular wave and trapezoidal wave. In view of the cost for producing a power source device, the frequency of AC is preferably from 30 to 200 Hz, more preferably from 40 to 120 Hz. In the case of using a trapezoidal wave as the waveform of AC, the time tp for each current to reach the peak from 0 is preferably 0.1 to 2 msec, more preferably from 0.3 to 1.5 msec. If the tp is less than 0.1 msec, this may affect the impedance of the power source circuit, and a large power source voltage at the rising of current waveform and in turn, a high equipment cost for the power source are required.

As for the hydrophilic particle, $Al_2O_3$, $TiO_2$, $SiO_2$ and $ZrO_2$ are preferably used individually or in combination of two or more thereof. The electrolytic solution is obtained, for example, by suspending the hydrophilic particles in water or the like such that the hydrophilic particle content becomes from 0.01 to 20 mass % based on the entire. The electrolytic solution may be subjected to adjustment of pH, for example, by adding a sulfuric acid so as to have plus or minus electric charge. The electrolysis is preformed, for example, by passing DC, assigning the aluminum sheet to the cathode and using the above-described electrolytic solution under the conditions such that the voltage is from 10 to 200 V and the treatment time is from 1 to 600 seconds. By this method, the micropore present in the anodic oxide film can be easily closed while leaving a void in its inside.

Also, the pore-sealing treatment may be performed by a method of coating and thereby providing, for example, a layer comprising a compound having at least one amino group and at least one group selected from the group consisting of a carboxyl group or a salt thereof and a sulfo group or a salt thereof described in JP-A-60-19491; a layer comprising a compound selected from compounds having at least one amino group and at least one hydroxyl group, and salts thereof described in JP-A-60-232998; a layer containing a phosphate described in JP-A-62-19494; or a layer comprising a polymer compound in which at least one monomer unit having a sulfo group is contained as a repeating unit in the molecule described in JP-A-59-101651.

In addition, the pore-sealing treatment may also be performed by a method of providing a layer comprising a compound selected from carboxymethyl cellulose; dextrin; gum arabic; phosphonic acids having an amino group, such as 2-aminoethylphosphonic acid; organophosphonic acids such as phenylphosphonic acid, naphthylphosphonic acid, alkyl-phosphonic acid, glycerophosphonic acid, methylenediphosphonic acid and ethylenediphosphonic acid, which are each may have a substituent; organophosphoric acid esters such as phenylphosphoric acid, naphthylphosphoric acid, alkylphosphoric acid and glycerophosphoric acid, which are each may have a substituent; organophosphinic acids such as phenylphosphinic acid, naphthylphosphinic acid, alkylphosphinic acid and glycerophosphinic acid, which are each may have a substituent; amino acids such as glycine and β-alanine; and hydrochlorides of amines having a hydroxyl group, such as hydrochloride of triethanolamine.

In the pore-sealing treatment, a silane coupling agent having an unsaturated group may be applied. Examples of the silane coupling agent include N-3-(acryloxy-2-hydroxypropyl)-3-aminopropyltriethoxysilane, (3-acryloxypropyl)dimethylmethoxysilane, (3-acryloxypropyl)methyldimethoxysilane, (3-acryloxypropyl)trimethoxysilane, 3-(N-allylamino)propyltrimethoxysilane, allyldimethoxysilane, allyltriethoxysilane, allyltrimethoxysilane, 3-butenyltriethoxysilane, 2-(chloromethyl)allyltrimethoxysilane, methacrylamidopropyltriethoxysilane, N-(3-methacryloxy-2-hydroxypropyl)-3-aminopropyltriethoxysilane, (methacryloxymethyl)dimethylethoxysilane, methacryloxymethyltriethoxysilane, methacryloxymethyltrimethoxysilane, methacryloxypropyldimethylethoxysilane, methacryloxypropyldimethylmethoxysilane, methacryloxypropylmethyldiethoxysilane, methacryloxypropylmethyldimethoxysilane, methacryloxypropylmethyltriethoxysilane, methacryloxypropylmethyltrimethoxysilane, methacryloxypropyltris(methoxyethoxy)silane, methoxydimethylvinylsilane, 1-methoxy-3-(trimethylsiloxy)butadiene, styrylethyltrimethoxysilane, 3-(N-styrylmethyl-2-aminoethylamino)-propyltrimethoxysilane hydrochloride, vinyldimethylethoxysilane, vinyldiphenylethoxysilane, vinylmethyldiethoxysilane, vinylmethyldimethoxysilane, o-(vinyloxyethyl)-N-(triethoxysilylpropyl)urethane, vinyltriethoxysilane, vinyltrimethoxysilane, vinyltri-tert-butoxysilane, vinyltriisopropoxysilane, vinyltriphenoxysilane, vinyltris(2-methoxyethoxy)silane and diallylaminopropylmethoxysilane. Among these, preferred are silane coupling agents having a methacryloyl group or an acryloyl group, which are high in the reactivity of unsaturated group.

Other examples of the pore-sealing treatment include a sol-gel coating treatment described in JP-A-5-50779, a treatment of coating phosphonic acids described in JP-A-5-246171, a treatment of coating a backcoat material described in JP-A-6-234284, JP-A-6-191173 and JP-A-6-230563, a treatment with phosphonic acids described in JP-A-6-262872, a coating treatment described in JP-A-6-297875, an anodization treatment described in JP-A-10-109480, and a dipping treatment described in JP-A-2000-81704 and JP-A-2000-89466, and any of these methods may be used.

After forming a hydrophilic film, the aluminum plate surface is subjected to a hydrophilization treatment, if desired.

The hydrophilization treatment includes an alkali metal silicate method described in U.S. Pat. Nos. 2,714,066, 3,181,461, 3,280,734 and 3,902,734. In this method, the support is dipped or electrolyzed in an aqueous solution of sodium silicate or the like. Other examples include a method of performing the treatment with potassium fluorozirconate described in JP-B-36-22063, and a method of performing the treatment with polyvinylphosphonic acid described in U.S. Pat. Nos. 3,276,868, 4,153,461 and 4,689,272.

In the case of using a support insufficient in the hydrophilicity on the surface, such as polyester film, for the support of the present invention, a hydrophilic layer is preferably coated to render the surface hydrophilic. Preferred examples of the hydrophilic layer include a hydrophilic layer formed by coating a coating solution containing a colloid of an oxide or hydroxide of at least one element selected from beryllium, magnesium, aluminum, silicon, titanium, boron, germanium, tin, zirconium, iron, vanadium, antimony and transition metals described in JP-A-2001-199175, a hydrophilic layer having an organic hydrophilic matrix obtained by crosslinking or pseudo-crosslinking an organic hydrophilic polymer described in JP-A-2002-79772, a hydrophilic layer having an inorganic hydrophilic matrix obtained by sol-gel conversion comprising hydrolysis and condensation reaction of polyalkoxysilane, titanate, zirconate or aluminate, and a hydrophilic layer comprising an inorganic thin film with the surface containing a metal oxide. Among these, a hydrophilic layer formed by coating a coating solution containing a colloid of an oxide or hydroxide of silicon is more preferred.

In the case of using polyester film or the like as the support of the present invention, an antistatic layer is preferably provided on the hydrophilic layer side of the support, on the opposite side or on both sides. When an antistatic layer is provided between the support and the hydrophilic layer, this contributes also to the enhancement of adhesion to the hydrophilic layer. Examples of the antistatic layer which can be used include a polymer layer having dispersed therein metal oxide fine particles or matting agent described in JP-A-2002-79772.

The support preferably has a center line average roughness of 0.10 to 1.2 μm. Within this range, good adhesion to the image forming layer, good press life and good antiscumming property can be obtained.

The color density of the support is preferably from 0.15 to 0.65 in terms of the reflection density value. Within this range, good image-forming property by virtue of antihalation at the image exposure and good suitability for plate inspection after development can be obtained.

[Backcoat Layer]

After the support is subjected to a surface treatment or formation of an undercoat layer, a backcoat may be provided on the back surface of the support, if desired.

Suitable examples of the backcoat include a coat layer comprising a metal oxide obtained by hydrolyzing and polycondensing an organic polymer compound described in JP-A-5-45885 or an organic or inorganic metal compound described in JP-A-6-35174. Among these, those using an alkoxy compound of silicon, such as $Si(OCH_3)_4$, $Si(OC_2H_5)_4$, $Si(OC_3H_7)_4$ and $Si(OC_4H_9)_4$, are preferred because the raw material is inexpensive and easily available.

[Undercoat Layer]

In the lithographic printing plate precursor of the present invention, if desired, an undercoat layer may be provided between the image forming layer and the support. The undercoat layer functions as a heat-insulating layer and therefore, the heat generated upon exposure by an infrared laser is prevented from diffusing into the support and can be efficiently used, so that the sensitivity can be advantageously elevated. Furthermore, in the unexposed area, the image forming layer is rendered easily separable from the support and therefore, the on-press developability is enhanced.

Specific examples of the undercoat layer include a silane coupling agent having an addition-polymerizable ethylenic double bond reactive group described in JP-A-10-282679, and a phosphorus compound having an ethylenic double bond reactive group described in JP-A-2-304441. Furthermore, compounds having a polymerizable group such as methacryl group or allyl group and a support adsorbing group such as sulfonic acid group, phosphoric acid group or phosphoric acid ester are also preferred. In addition, compounds obtained by adding a hydrophilicity-imparting group such as ethyleneoxy group to the above-described compounds are also suitably used.

The amount coated (solid content) of the undercoat layer is preferably from 0.1 to 100 mg/m$^2$, more preferably from 1 to 30 mg/m$^2$.

[Protective Layer (Overcoat Layer)]

In the lithographic printing plate precursor of the present invention, a protective layer may be provided on the image forming layer, if desired, for the purpose of preventing generation of scratches or the like on the image forming layer, blocking oxygen or preventing ablation at the exposure with a high-intensity laser.

In the present invention, the exposure is usually performed in air and the protective layer prevents low molecular compounds such as oxygen and basic substance present in air, which inhibit an image-forming reaction occurring upon exposure in the image forming layer, from mixing into the image forming layer and thereby prevents inhibition of the image-forming reaction at the exposure in air. Accordingly, the property required of the protective layer is low permeability to low molecular compounds such as oxygen. Furthermore, the protective layer preferably has good transparency to light used for exposure, excellent adhesion to the image forming layer, and easy removability in the on-press development process after exposure. Various studies have been heretofore made on the protective layer having these properties and such protective layers are described in detail, for example, in U.S. Pat. No. 3,458,311 and JP-B-55-49729.

Examples of the material used for the protective layer include water-soluble polymer compounds having relatively excellent crystallinity. Specific examples thereof include water-soluble polymers such as polyvinyl alcohol, polyvinylpyrrolidone, acidic celluloses, gelatin, gum arabic and polyacrylic acid. In particular, when polyvinyl alcohol (PVA) is used as the main component, most excellent results are obtained with respect to basic properties such as oxygen-blocking property and development removability. As long as the polyvinyl alcohol contains an unsubstituted vinyl alcohol unit for giving necessary oxygen-blocking property and water solubility to the protective layer, a part thereof may be replaced by an ester, an ether or an acetal or may have other copolymerization components.

Examples of the polyvinyl alcohol which can be suitably used include those having a hydrolysis degree of 71 to 100% and a polymerization degree of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The components (for example, selection of PVA and use of additives), coated amount and the like of the protective layer are appropriately selected by taking account of fogging, adhesion, scratch resistance and the like in addition to the oxygen-blocking property and development removability. In general, as the PVA has a higher percentage of hydrolysis (namely, as the unsubstituted vinyl alcohol unit content in the protective layer is higher) or as the layer thickness is larger, the oxygen-blocking property is enhanced and this is preferred in view of sensitivity. Also, in order to prevent unnecessary polymerization reaction during production or storage as well as unnecessary fogging at the image exposure or thickening or the like of the image line, an excessively high oxygen permeability is not preferred. Accordingly, the oxygen permeability A at 25° C. and 1 atm is preferably $0.2 \leqq A \leqq 20$ (ml/m$^2$·day).

As for other components of the protective layer, glycerin, dipropylene glycol or the like may be added in an amount corresponding to several mass % based on the water-soluble polymer compound so as to impart flexibility. Also, an anionic surfactant such as sodium alkylsulfate and sodium alkylsulfonate; an amphoteric surfactant such as alkylaminocarboxylate and alkylaminodicarboxylate; or a nonionic surfactant such as polyoxyethylene alkylphenyl ether may be added in an amount of several mass % based on the (co)polymer.

The thickness of the protective layer is suitably from 0.1 to 5 1m, preferably from 0.2 to 2 μm.

The adhesion to the image area, scratch resistance and the like of the protective layer are also very important in view of handling of the lithographic printing plate precursor. More specifically, in the case where the image forming layer is lipophilic, if a protective layer which is hydrophilic by containing a water-soluble polymer compound is stacked on the image forming layer, the protective layer is readily separated due to insufficient adhesive strength and in the separated portion, defects such as curing failure ascribable to polymerization inhibition by oxygen is sometimes caused.

In order to solve this problem, various proposals have been made with an attempt to improve the adhesive property between the image forming layer and the protective layer. For example, JP-A-49-70702 and Unexamined British Patent Publication No. 1,303,578 describe a technique of mixing from 20 to 60 mass % of an acrylic emulsion, a water-insoluble vinylpyrrolidone-vinyl acetate copolymer or the like in a hydrophilic polymer mainly comprising polyvinyl alcohol and stacking the obtained solution on the image forming layer, thereby obtaining sufficiently high adhesive property. In the present invention, these known techniques all can be used. The method for coating the protective layer is described in detail, for example, in U.S. Pat. No. 3,458,311 and JP-B-55-49729.

In the present invention, the above-described printout image-forming component (for example, a compound represented by formula (1), a compound of interacting with a thermal decomposition product of the compound and thereby changing in the color, a compound of causing change in the color by the effect of a radical, and an infrared absorbent) can be incorporated into the protective layer. The embodiment of incorporating these printout image-forming components into the protective layer but not into the image forming layer is preferred, because the printout image-forming reaction system is separated from the polymerization reaction system in the image forming layer and these reaction systems are prevented from inhibiting each other's reaction. It is also a preferred embodiment to enclose these printout image-forming components in a microcapsule and incorporate the microcapsule into the protective layer. In the case of strengthening the printout image, such printout image-forming components may be incorporated into both the protective layer and the image forming layer.

Furthermore, other functions may be imparted to the protective layer. For example, when a colorant (for example, water-soluble dye) excellent in the transparency to infrared ray used for exposure and capable of efficiently absorbing light at other wavelengths is added, the aptitude for safelight can be enhanced without causing reduction in the sensitivity.

[Exposure]

The lithographic printing plate precursor of the present invention is used by imagewise exposing it with an infrared laser.

The infrared laser used here is not particularly limited, but suitable examples thereof include a solid or semiconductor laser of emitting an infrared ray at a wavelength of 760 to 1,200 nm. The output of the infrared laser is preferably 100 mW or more and in order to shorten the exposure time, a multi-beam laser device is preferably used.

The exposure time is preferably 20 μ seconds or less per one picture element. The amount of energy irradiated is preferably from 10 to 300 mJ/cm$^2$.

In the present invention, by this exposure, a color image with good visibility can be obtained at the same time with formation of a printing image.

[Printing Method]

After imagewise exposure with an infrared laser, the lithographic printing plate precursor of the present invention can be used for printing by supplying an oily ink and an aqueous component without passing through any development processing step.

Specific examples of the method therefor include a method of exposing the lithographic printing plate precursor with an infrared laser, then loading it on a printing press without passing through a development processing step, and performing printing, and a method of loading the lithographic printing plate precursor on a printing press, exposing it with an infrared laser on the printing press, and performing printing as-is.

For example, in one embodiment of the negative on-press development-type lithographic printing plate precursor, when the lithographic printing plate precursor is imagewise exposed with an infrared laser and then printing is performed by supplying an aqueous component and an oily ink without passing through a development processing step such as wet development, the image forming layer cured by the exposure forms an oily ink-receiving part with lipophilic surface in the exposed area of the image forming layer. On the other hand, in the unexposed area, the uncured image forming layer is removed by dissolving or dispersing in the supplied aqueous component and/or oily ink and the hydrophilic support surface in this portion is revealed.

As a result, the aqueous component adheres to the revealed hydrophilic surface and the oily ink adheres to the image forming layer in the exposed region, thereby initiating the printing. Here, either the aqueous component or the oily ink may be first supplied to the plate surface, but the oily ink is preferably first supplied in the light of preventing the aqueous component from contamination by the image forming layer in the unexposed area. A fountain solution and a printing ink for normal lithographic printing are used as the aqueous component and oily ink, respectively.

In this way, the lithographic printing plate precursor is on-press developed on an off-set printing press and used as-is for printing of a large number of sheets.

EXAMPLES

The present invention is described in greater detail below by referring to the Examples, but the present invention should not be construed as being limited thereto.

Example 1

(Preparation of Support)

A 0.3 mm-thick aluminum plate comprising a construction material according to JIS-A-1050 was treated through the following steps (a) to (k) in this order.

(a) Mechanical Surface-Roughening Treatment

A mechanical surface-roughening treatment was performed by using a rotating roller-shaped nylon brush while supplying an abrasive slurry suspension of an abrasive (quartz sand) having a specific gravity of 1.12 in water to the aluminum plate surface. The average particle diameter of the abrasive was 8 μm and the maximum particle diameter was 50 μm. The nylon brush used was made of 6.10-nylon and had a bristle length of 50 mm and a bristle diameter of 0.3 mm. This nylon brush was produced by perforating holes in a stainless steel-made cylinder having a diameter of 300 mm and densely implanting bristles in the holes. Three rotary brushes were used. The distance between two support rollers (ϕ200 mm) disposed below the brush was 300 mm. The brush roller was pressed to the aluminum plate until the load of the driving motor for rotating the brush became 7 kW larger than the load before the brush roller was pressed to the aluminum plate. The rotating direction of the brush was the same as the moving direction of the aluminum plate. The rotation number of the brush was 200 rpm.

(b) Alkali Etching

An etching treatment was performed by spraying an aqueous NaOH solution (concentration: 26 mass %, aluminum ion concentration: 6.5 mass %) at a temperature of 70° C. on the obtained aluminum plate to dissolve 6 $g/m^2$ of the aluminum plate. Thereafter, the aluminum plate was washed with well water by spraying.

(c) Desmutting Treatment

A desmutting treatment was performed by spraying an aqueous solution having a nitric acid concentration of 1 mass % (containing 0.5 mass % of aluminum ion) at a temperature of 30° C., and then the aluminum plate was water-washed by spraying. For the aqueous nitric acid solution used for the desmutting, the waste solution in the step of performing electrochemical surface-roughening by using AC in an aqueous nitric acid solution was used.

(d) Electrochemical Surface-Roughening Treatment

An electrochemical surface-roughening treatment was continuously performed by using AC voltage of 60 Hz. At this time, the electrolytic solution was an aqueous solution containing 10.5 g/liter of nitric acid (containing 5 g/liter of aluminum ion) at a temperature of 50° C. The electrochemical surface-roughening treatment was performed by using trapezoidal wave AC such that the time TP necessary for the current value to reach the peak from 0 was 0.8 msec and the duty ratio was 1:1, and disposing a carbon electrode as the counter electrode. The auxiliary anode was ferrite. The electrolytic cell used was a radial cell type. The current density was 30 $A/dm^2$ in terms of the peak value of current, the total quantity of electricity at the time of aluminum plate serving as anode was 220 $C/dm^2$, and 5% of the current flowing from the power source was split to the auxiliary anode. Thereafter, the aluminum plate was washed with well water by spraying.

(e) Alkali Etching Treatment

The aluminum plate was etched at 32° C. by spraying an etching solution having a sodium hydroxide concentration of 26 mass % and an aluminum ion concentration of 6.5 mass % to dissolve 0.20 $g/m^2$ of the aluminum plate, smut components mainly comprising aluminum hydroxide produced at the electrochemical surface-roughening performed by using AC in the previous stage were removed, and the edge portion of the produced pit was dissolved to smoothen the edge portion. Thereafter, the aluminum plate was washed with well water by spraying. The etched amount was 3.5 $g/m^2$.

(f) Desmutting Treatment

A desmutting treatment was performed by spraying an aqueous solution having a nitric acid concentration of 15 mass % (containing 4.5 mass % of aluminum ion) at a temperature of 30° C., and then the aluminum plate was washed with well water by spraying. For the aqueous nitric acid solution used for the desmutting, the waste solution in the step of performing electrochemical surface-roughening by using AC in an aqueous nitric acid solution was used.

(g) Electrochemical Surface-Roughening Treatment

An electrochemical surface-roughening treatment was continuously performed by using AC voltage of 60 Hz. At this time, the electrolytic solution was an aqueous solution containing 7.5 g/liter of hydrochloric acid (containing 5 g/liter of aluminum ion) at a temperature of 35° C. The electrochemical surface-roughening treatment was performed by using an AC power source having a rectangular waveform and disposing a carbon electrode as the counter electrode. The auxiliary anode was ferrite. The electrolytic cell used was a radial cell type. The current density was 25 $A/dm^2$ in terms of the peak value of current, and the total quantity of electricity at the time of aluminum plate serving as anode was 50 $C/dm^2$. Thereafter, the aluminum plate was washed with well water by spraying.

(h) Alkali Etching Treatment

The aluminum plate was etched at 32° C. by spraying an etching solution having a sodium hydroxide concentration of 26 mass % and an aluminum ion concentration of 6.5 mass % to dissolve 0.10 $g/m^2$ of the aluminum plate, smtit components mainly comprising aluminum hydroxide produced at the electrochemical surface-roughening performed by using AC in the previous stage were removed, and the edge portion of the produced pit was dissolved to smoothen the edge portion. Thereafter, the aluminum plate was washed with well water by spraying.

(i) Desmutting Treatment

A desmutting treatment was performed by spraying an aqueous solution having a sulfuric acid concentration of 25 mass % (containing 0.5 mass % of aluminum ion) at a temperature of 60° C., and then the aluminum plate was washed with well water by spraying.

(j) Anodization Treatment

For the electrolytic solution, sulfuric acid was used. The electrolytic solution had a sulfuric acid concentration of 170 g/liter (containing 0.5 mass % of aluminum ion) and at a temperature of 43° C. Thereafter, the aluminum plate was washed with well water by spraying. The current density was about 30 $A/dm^2$. The final oxide film coverage was 2.7 $g/m^2$.

(k) Alkali Metal Silicate Treatment

An alkali metal silicate treatment (silicate treatment) was performed by dipping the resulting aluminum plate in a treating tank containing an aqueous 1 mass % No. 3 sodium silicate solution at a temperature of 30° C. for 10 seconds. Thereafter, the aluminum plate was washed with well water by spraying to produce an aluminum support. At this time, the silicate add-in amount was 3.6 $mg/m^2$.

(Formation of Image Forming Layer)

On the obtained support, Coating Solution (1) for Image Forming Layer having the following composition was coated by a wire bar and dried at 80° C. for 60 seconds to form an image forming layer. The coated amount was 1.0 $g/m^2$.

| <Composition of Coating Solution (1) for Image Forming Layer> | |
|---|---|
| Infrared Absorbent (D-1) shown below | 2 parts by mass |
| Radical Polymerization Initiator (I-1) shown below | 10 parts by mass |
| Dipentaerythritol hexaacrylate (NK Ester A-DPH, produced by Shin-Nakamura Chemical Co., Ltd. | 55 parts by mass |
| Binder Polymer (B-1) shown below | 37 parts by mass |
| Compound (C-1) shown below | 10 parts by mass |
| Fluorine-Containing Surfactant (W-1) shown below | 6 parts by mass |
| Methyl ethyl ketone | 900 parts by mass |

Infrared Absorbent (D-1):

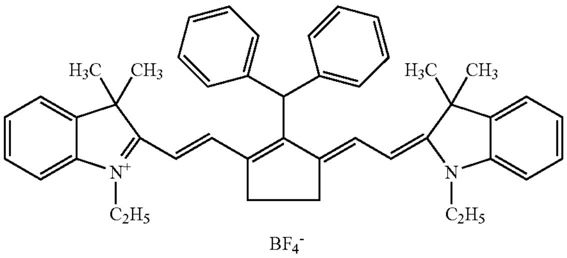

Radical Polymerization Initiator (I-1):

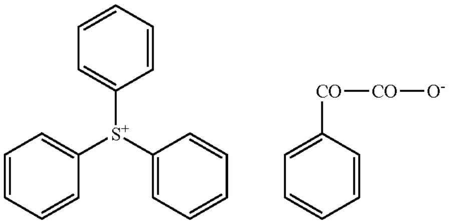

Binder Polymer (B-1i):

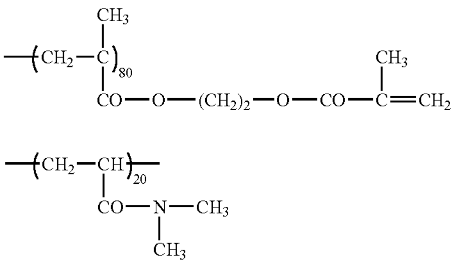

Mass average molecular weight: 65,000

Compound (C-1):

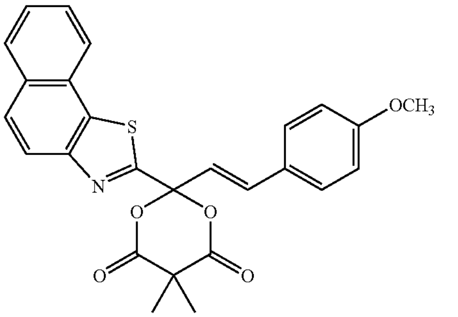

-continued

<Composition of Coating Solution (1) for Image Forming Layer>

Fluorine-Containing Surfactant (W-1):

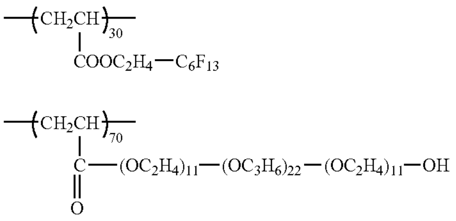

(Evaluation of Lithographic Printing Plate Precursor)

On the obtained lithographic printing plate precursor, a test pattern was image-exposed by an image setter (Trendsetter 3244VX, manufactured by Creo) at a beam intensity of 10.2 W and a drum rotation speed of 150 rpm. The contrast between unexposed region and exposed region, that is, clear viewing of image (visibility), was evaluated, and the lightness difference (ΔL) was measured by 500 Series Spectrodensitometer, manufactured by X-Rite. Without passing through development processing, this plate was loaded on a cylinder of a printing press (SPRINT S26, manufactured by Komori Corp.). Thereafter, printing was performed by supplying, as the fountain solution, a 4% diluted solution of a commercially available fountain stock solution (IF-102, produced by Fuji Photo Film Co., Ltd.), then supplying black ink (Values-G (black) produced by Dai-Nippon Ink & Chemicals, Inc.), and further supplying paper. The number of sheets required until a good printed matter could be obtained (on-press developability) and the number of sheets on which an image could be printed without causing staining or thinning (press life) were evaluated. The results are shown in Table 1.

Example 2

A lithographic printing plate precursor was produced in the same manner as in Example 1 except for using Compound (C-2) in place of Compound (C-1). The produced lithographic printing plate precursor was evaluated in the same manner as in Example 1. The results are shown in Table 1.

Compound (C-2):

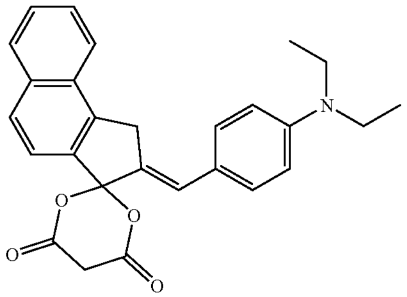

Example 3

On the support produced in Example 1, Coating Solution (2) for Image Forming Layer having the following Composition was coated by a wire bar and dried at 80° C. for 60 seconds to form an image forming layer. The coated amount was 1.0 g/m$^2$. The obtained lithographic printing plate precursor was evaluated in the same manner as in Example 1. The results are shown in Table 1.

| <Composition of Coating Solution (2) for Image Forming Layer> | |
|---|---|
| Infrared Absorbent (D-1) shown below | 2 parts by mass |
| Radical Polymerization Initiator (I-1) | 10 parts by mass |
| Dipentaerythritol hexaacrylate (NK Ester A-DPH, produced by Shin-Nakamura Chemical Co., Ltd.) | 55 parts by mass |
| Binder Polymer (B-1) | 37 parts by mass |
| Compound (C-1) | 10 parts by mass |
| Acid Generator (A-1) shown below | 2 parts by mass |
| Fluorine-Containing Surfactant (W-1) | 6 parts by mass |
| Methyl ethyl ketone | 900 parts by mass |

Acid Generator (A-1):

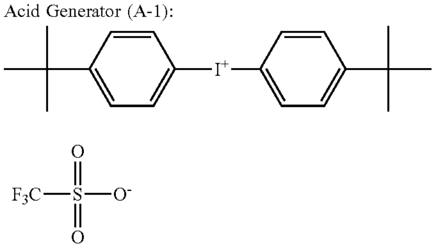

Comparative Example 1

A lithographic printing plate precursor was produced in the same manner as in Example 1 except for removing Compound (C-1). The produced lithographic printing plate precursor was evaluated in the same manner as in Example 1. The results are shown in Table 1.

TABLE 1

| Lithographic Printing Plate Precursor | Visibility | ΔL | On-Press Developability | Press Life |
|---|---|---|---|---|
| Example 1 | Good | 3.5 | 80 sheets | 7,000 sheets |
| Example 2 | Good | 2.1 | 70 sheets | 7,000 sheets |
| Example 3 | Good | 2.9 | 50 sheets | 8,000 sheets |
| Comparative Example 1 | Bad | 0.9 | 70 sheets | 7,000 sheets |

Example 4

On the support produced in Example 1, Coating Solution (3) for Image Forming Layer having the following Composition was coated by a wire bar and dried at 80° C. for 60 seconds to form an image forming layer. The coated amount was 1.0 g/m$^2$.

| <Composition of Coating Solution (3) for Image Forming Layer> | |
|---|---|
| Infrared Absorbent (D-1) | 2 parts by mass |
| Radical Polymerization Initiator (I-1) | 10 parts by mass |
| Dipentaerythritol hexaacrylate (NK Ester A-DPH, produced by Shin-Nakamura Chemical Co., Ltd.) | 55 parts by mass |
| Binder Polymer (B-1) | 37 parts by mass |
| Compound (C-3) shown below | 10 parts by mass |
| Color-Change Compound (F-1) shown below | 10 parts by mass |
| Fluorine-Containing Surfactant (W-1) | 6 parts by mass |
| Methyl ethyl ketone | 900 parts by mass |

Compound (C-3):

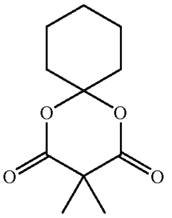

Color-Change Compound (F-1):

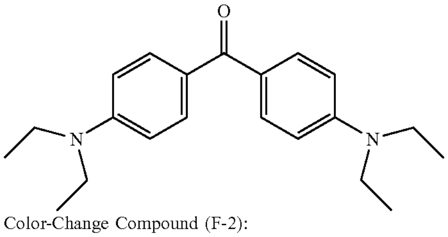

Color-Change Compound (F-2):

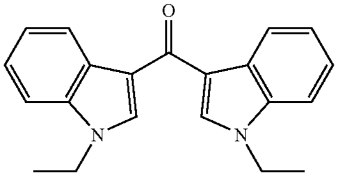

The obtained lithographic printing plate precursor was evaluted in the same manner as in Example 1. The results are shown in Table 2.

Example 5

A lithographic printing plate precursor was produced in the same manner as in Example 4 except for using Color-Change Compound (F-2) in place of Color-Change Compound (F-1). The produced lithographic printing plate precursor was evaluated in the same manner as in Example 1. The results are shown in Table 2.

Example 6

A lithographic printing plate precursor was produced in the same manner as in Example 4 except for using Compound (C-1) in place of Compound (C-3). The produced lithographic printing plate precursor was evaluated in the same manner as in Example 1. The results are shown in Table 2.

Comparative Example 2

A lithographic printing plate precursor was produced in the same manner as in Example 4 except for removing Color-Change Compound (F-1) and Compound (C-3). The produced lithographic printing plate precursor was evaluated in the same manner as in Example 1. The results are shown in Table 2.

Comparative Example 3

A lithographic printing plate precursor was produced in the same manner as in Example 4 except for removing Compound (C-3). The produced lithographic printing plate precursor was evaluated in the same manner as in Example 1. The results are shown in Table 2.

TABLE 2

| Lithographic Printing Plate Precursor | Visibility | ΔL | On-Press Developability | Press Life |
|---|---|---|---|---|
| Example 4 | Good | 3.5 | 80 sheets | 7,000 sheets |
| Example 5 | Good | 4.2 | 70 sheets | 7,000 sheets |
| Example 6 | Good | 3.7 | 70 sheets | 8,000 sheets |
| Comparative Example 2 | Bad | 0.8 | 80 sheets | 7,000 sheets |
| Comparative Example 3 | Bad | 0.7 | 70 sheets | 7,000 sheets |

Example 7

(Preparation of Microcapsule Liquid Dispersion (1))

In 16.5 parts by mass of ethyl acetate, 10 parts by mass of trimethylolpropane and xylene diisocyanate adduct (1:3 by mol) (Takenate D-110N, produced by Mitsui Takeda Chemicals, Inc., containing 25 mass % of ethyl acetate), 4 parts by mass of Compound (C-1), 0.6 parts by mass of Infrared Absorbent (D-3) shown below, 1.5 parts by mass of tricresyl phosphate and 0.1 part by mass of anionic surfactant (Pionin P-A41C, produced by Takemoto Yushi Co., Ltd.) were dissolved-dispersed to obtain an oil phase. Separately, 37.5 parts by mass of an aqueous 4 mass % polyvinyl alcohol (PVA-205, produced by Kuraray Co., Ltd.) solution was prepared and used as an aqueous phase.

The oil phase and the aqueous phase were mixed and emulsified in a homogenizer at 12,000 rpm for 10 minutes under water cooling. Thereafter, 24.5 parts by mass of water was added to the resulting emulsified product and the mixture was stirred at room temperature for 30 minutes and further stirred at 40° C. for 3 hours. To this liquid dispersion, distilled water was added to a solid content concentration of 15 mass % to prepare Microcapsule Liquid Dispersion (1). The average particle diameter of microcapsules was 0.30 μm.

(Formation of Image Forming Layer)

On the support produced in Example 1, Coating Solution (4) for Image Forming Layer having the following Composition was coated by a wire bar and dried at 80° C. for 60 seconds to form an image forming layer. The coated amount was 1.0 $g/m^2$.

| <Composition of Coating Solution (4) for Image Forming Layer> | |
|---|---|
| Infrared Absorbent (D-1) | 2 parts by mass |
| Radical Polymerization Initiator (I-1) | 10 parts by mass |
| Dipentaerythritol hexaacrylate (NK Ester A-DPH, produced by Shin-Nakamura Chemical Co., Ltd.) | 55 parts by mass |
| Binder Polymer (B-1) | 37 parts by mass |
| Fluorine-Containing Surfactant (W-1) | 1 part by mass |
| Methyl ethyl ketone | 900 parts by mass |

On the image forming layer (4), Coating Solution (2) for Water-Soluble Overcoat Layer having the following composition was coated by a wire bar to give a dry coated amount of 1.5 $g/m^2$ and then dried at 100° C. for 90 seconds to produce a lithographic printing plate precursor. The produced lithographic printing plate precursor was evaluated in the same manner as in Example 1. The results are shown in Table 3.

| <Composition of Coating Solution (2) for Water-Soluble Overcoat Layer> | |
|---|---|
| Polyvinyl alcohol (saponification degree: 98 mol %, polymerization degree: 500) | 95 parts by mass |
| Polyvinylpyrrolidone/vinyl acetate copolymer (Luvitec VA 64W, produced by BASF) | 4 parts by mass |
| Nonionic surfactant (EMALEX 710, produced by Nihon Emulsion Co., Ltd.) | 1 part by mass |
| Microcapsule Liquid Dispersion (1) | 1,000 parts by mass |
| Distilled water | 2,150 parts by mass |

Example 8

(Formation of Image Forming Layer)

On the support produced in Example 1, Coating Solution (5) for Image Forming Layer having the following Composition was coated by a wire bar and dried at 80° C. for 60 seconds to form an image forming layer. The coated amount was 1.0 $g/m^2$. The produced lithographic printing plate precursor was evaluated in the same manner as in Example 1. The results are shown in Table 3.

| <Composition of Coating Solution (5) for Image Forming Layer> | |
|---|---|
| Infrared Absorbent (D-1) | 2 parts by mass |
| Radical Polymerization Initiator (I-1) | 10 parts by mass |
| Dipentaerythritol hexaacrylate (NK Ester A-DPH, produced by Shin-Nakamura Chemical Co., Ltd. | 40 parts by mass |
| Binder Polymer (B-1) | 16 parts by mass |
| Microcapsule Liquid Dispersion (1) | 300 parts by mass |
| Fluorine-Containing Surfactant (W-1) | 1 part by mass |
| Methyl ethyl ketone | 100 parts by mass |
| 1-Methoxy-3-propanol | 850 parts by mass |
| Distilled water | 200 parts by mass |

TABLE 3

| Lithographic Printing Plate Precursor | Visibility | ΔL | On-Press Developability | Press Life |
|---|---|---|---|---|
| Example 7 | good | 3.8 | 30 sheets | 10,000 sheets |
| Example 8 | good | 3.5 | 30 sheets | 10,000 sheets |

As seen from the results shown above, the lithographic printing plate precursor of the present invention ensures good image visibility and is excellent in both the on-press developability and the press life.

This application is based on Japanese patent application JP 2004-1211872, filed on Jul. 20, 2004, the entire content of which is hereby incorporated by reference, the same as if set forth at length.

What is claimed is:

1. An image forming material comprising a support and a layer, wherein the layer comprises a compound that is represented by formula (1) and changes from a colorless state to a colored state by the effect of heat:

(1)

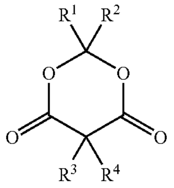

wherein $R^1$ to $R^4$ each independently represents a hydrogen atom, an alkyl group, an aryl group, an alkenyl group, an alkynyl group, a halogen atom, an acyl group, an alkyloxy group, an alkenyloxy group, an alkynyloxy group, an aryloxy group, a sulfonyl group, a sulfinyl group, an alkoxycarbonyl group, an aryloxycarbonyl group, an alkylthio group, an arylthio group, an acyloxy group, a sulfonyloxy group, a carbamoyloxy group, an amino group, a carbamoyl group, a sulfamoyl group, a hydroxyl group, a nitro group, a cyano group, a carboxyl group or a heterocyclic group.

2. An image forming material comprising a support and a layer, wherein the layer comprises: a compound represented by formula (1); and a compound of interacting with a thermal decomposition product of said compound represented by formula (1) to change color:

(1)

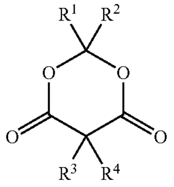

wherein $R^1$ to $R^4$ each independently represents a hydrogen atom, an alkyl group, an aryl group, an alkenyl group, an alkynyl group, a halogen atom, an acyl group, an alkyloxy group, an alkenyloxy group, an alkynyloxy group, an aryloxy group, a sulfonyl group, a sulfinyl group, an alkoxycarbonyl group, an aryloxycarbonyl group, an alkylthio group, an arylthio group, an acyloxy group, a sulfonyloxy group, a carbamoyloxy group, an amino group, a carbamoyl group, a sulfamoyl group, a hydroxyl group, a nitro group, a cyano group, a carboxyl group or a heterocyclic group.

3. A lithographic printing plate precursor comprising a surface-hydrophilic support and a layer, wherein the layer comprises a compound that is represented by formula (1) and changes from a colorless state to a colored state by the effect of heat:

(1)

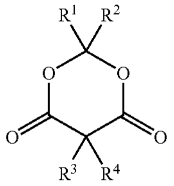

wherein $R^1$ to $R^4$ each independently represents a hydrogen atom, an alkyl group, an aryl group, an alkenyl group, an alkynyl group, a halogen atom, an acyl group, an alkyloxy group, an alkenyloxy group, an alkynyloxy group, an aryloxy group, a sulfonyl group, a sulfinyl group, an alkoxycarbonyl group, an aryloxycarbonyl group, an alkylthio group, an arylthio group, an acyloxy group, a sulfonyloxy group, a carbamoyloxy group, an amino group, a carbamoyl group, a sulfamoyl group, a hydroxyl group, a nitro group, a cyano group, a carboxyl group or a heterocyclic group.

4. A lithographic printing plate precursor comprising a surface-hydrophilic support and a layer, wherein the layer comprises: a compound represented by formula (1); and a compound of interacting with a thermal decomposition product of said compound represented by formula (1) to change color:

(1)

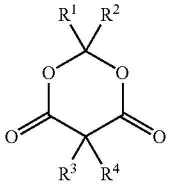

wherein $R^1$ to $R^4$ each independently represents a hydrogen atom, an alkyl group, an aryl group, an alkenyl group, an alkynyl group, a halogen atom, an acyl group, an alkyloxy group, an alkenyloxy group, an alkynyloxy group, an aryloxy group, a sulfonyl group, a sulfinyl group, an alkoxycarbonyl group, an aryloxycarbonyl group, an alkylthio group, an arylthio group, an acyloxy group, a sulfonyloxy group, a carbamoyloxy group, an amino group, a carbamoyl group, a sulfamoyl group, a hydroxyl group, a nitro group, a cyano group, a carboxyl group or a heterocyclic group.

5. The lithographic printing plate precursor as claimed in claim 3, wherein the layer further comprises a radical polymerization initiator and a radical polymerizable compound.

6. The lithographic printing plate precursor as claimed in claim 4, wherein the layer further comprises a radical polymerization initiator and a radical polymerizable compound.

7. The lithographic printing plate precursor as claimed in claim 3, which is capable of recording an image by exposure with an infrared laser.

8. The lithographic printing plate precursor as claimed in claim 4, which is capable of recording an image by exposure with an infrared laser.

9. The lithographic printing plate precursor as claimed in claim 3, which is capable of performing printing by loading said lithographic printing plate precursor on a printing press without passing through a development step after recording an image, or by recording an image after loading said lithographic printing plate precursor on a printing press.

10. The lithographic printing plate precursor as claimed in claim 4, which is capable of performing printing by loading said lithographic printing plate precursor on a printing press without passing through a development step after recording an image, or by recording an image after loading said lithographic printing plate precursor on a printing press.

11. A lithographic printing method comprising performing printing by loading the lithographic printing plate precursor claimed in claim 9 on a printing press without passing through a development step after recording an image, or by recording an image after loading said lithographic printing plate precursor on a printing press.

12. A lithographic printing method comprising performing printing by loading the lithographic printing plate precursor claimed in claim 10 on a printing press without passing through a development step after recording an image, or by recording an image after loading said lithographic printing plate precursor on a printing press.

* * * * *